(12) United States Patent
Gorbachov et al.

(10) Patent No.: US 11,356,084 B2
(45) Date of Patent: Jun. 7, 2022

(54) LOW-LOSS BI-DIRECTIONAL PASSIVE LSB PHASE SHIFTER IN MM-WAVE CMOS

(71) Applicant: Mobix Labs, Inc., Irvine, CA (US)

(72) Inventors: Oleksandr Gorbachov, Irvine, CA (US); Lisette L. Zhang, Irvine, CA (US)

(73) Assignee: Mobix Labs, Inc., Irvine, CA (US)

( * ) Notice: Subject to any disclaimer, the term of this patent is extended or adjusted under 35 U.S.C. 154(b) by 0 days.

(21) Appl. No.: 17/391,233

(22) Filed: Aug. 2, 2021

(65) Prior Publication Data

US 2022/0045667 A1  Feb. 10, 2022

Related U.S. Application Data

(60) Provisional application No. 63/061,042, filed on Aug. 4, 2020.

(51) Int. Cl.
*H03K 5/13* (2014.01)
*H03K 5/01* (2006.01)
*H03K 5/00* (2006.01)

(52) U.S. Cl.
CPC ..... *H03K 5/01* (2013.01); *H03K 2005/00286* (2013.01)

(58) Field of Classification Search
CPC ..................... H03K 5/01; H03K 2005/00286
USPC ........................................................ 327/231
See application file for complete search history.

(56) References Cited

U.S. PATENT DOCUMENTS

| 8,928,428 | B2* | 1/2015 | Gorbachov | H01P 5/185 333/109 |
| 9,093,734 | B2* | 7/2015 | Gorbachov | H01P 5/184 |
| 10,587,028 | B1* | 3/2020 | Gorbachov | H01P 5/185 |
| 2007/0241835 | A1* | 10/2007 | Horng | H03C 3/403 332/103 |

(Continued)

OTHER PUBLICATIONS

Firouzjaei, Ehsan Adabi; "mm-Wave Phase Shifters and Switches: A dissertation submitted in partial satisfaction of the requirements for the degree of Doctor of Philosophy in Engineering-Electrical Engineering and Computer Science in the Graduate Division of the University of California, Berkeley"; 114 pages; 2010.

(Continued)

*Primary Examiner* — Ryan Jager
(74) *Attorney, Agent, or Firm* — Stetina Brunda Garred & Brucker

(57) ABSTRACT

A phase shifter with a first port and a second port has a triple inductor network with a center inductor connected to the first port and the second port, and first and second peripheral inductors each electromagnetically coupled to the center inductor. A resistance switch network that is connected to the first and second peripheral inductors. The resistance switch network is selectively activatable to set a first state defined at least by a first resistance in a series circuit with the first and second peripheral inductors, a second state defined at least by a second resistance in the series circuit, and a third state defined at least by a third resistance in the series circuit. A transmission signal from the first port to the second port is shifted in phase by a prescribed angle corresponding to forward transmission coefficients for the first state, second state, and third state.

20 Claims, 18 Drawing Sheets

(56) References Cited

U.S. PATENT DOCUMENTS

| | | | |
|---|---|---|---|
| 2012/0161898 A1* | 6/2012 | Gorbachov | H01P 5/185 333/112 |
| 2014/0306778 A1* | 10/2014 | Gorbachov | H01P 5/184 333/112 |
| 2015/0042412 A1* | 2/2015 | Imbornone | H01P 5/18 333/112 |
| 2015/0130539 A1* | 5/2015 | Gorbachov | H03F 1/565 330/260 |
| 2017/0163215 A1* | 6/2017 | Gorbachov | H03F 3/245 |
| 2017/0194688 A1* | 7/2017 | Sharma | H01P 5/16 |

OTHER PUBLICATIONS

Masserddine, Victoria; "Millimeter-wave Phase Shifters Based on Tunable Transmission Lines in MEMS Technology Post-CMOS Process"; 129 pages; Jun. 5, 2018.

Kobal, Enis; "Comparative Design of Millimeter Wave RF-MEMS Phase Shifters: A Thesis Submitted to the Graduate School of Natural and Applied Sciences of Middle East Technical University"; 85 pages; Jun. 2016.

* cited by examiner

LOW-LOSS BI-DIRECTIONAL PASSIVE LSB PHASE SHIFTER IN MM-WAVE CMOS

CROSS-REFERENCE TO RELATED APPLICATIONS

This application relates to and claims the benefit of U.S. Provisional Application No. 63/061,042, filed Aug. 4, 2020 and entitled "LOW-LOSS BI-DIRECTIONAL PASSIVE LSB PHASE SHIFTER IN MM-WAVE CMOS", the disclosure of which is wholly incorporated by reference in its entirety herein.

STATEMENT RE: FEDERALLY SPONSORED RESEARCH/DEVELOPMENT

Not Applicable

BACKGROUND

1. Technical Field

The present disclosure relates generally to radio frequency (RF) integrated circuits and complementary metal oxide semiconductor (CMOS) devices, and more particularly, to low-loss, millimeter wave bi-directional passive least significant bit (LSB) phase shifters.

2. Related Art

Wireless communications systems find applications in numerous contexts involving information transfer over long and short distances alike, and a wide range of modalities tailored for each need have been developed. Chief among these systems with respect to popularity and deployment is the mobile or cellular phone. Generally, wireless communications utilize a radio frequency carrier signal that is modulated to represent data, and the modulation, transmission, receipt, and demodulation of the signal conform to a set of standards for coordination of the same. Many different mobile communication technologies or air interfaces exist, including GSM (Global System for Mobile Communications), EDGE (Enhanced Data rates for GSM Evolution), and UMTS (Universal Mobile Telecommunications System).

Various generations of these technologies exist and are deployed in phases, the latest being the 5G broadband cellular network system. 5G is characterized by significant improvements in data transfer speeds resulting from greater bandwidth that is possible because of higher operating frequencies compared to 4G and earlier standards. The air interfaces for 5G networks are comprised of two frequency bands, frequency range 1 (FR1), the operating frequency of which being below 6 GHz with a maximum channel bandwidth of 100 MHz, and frequency range 2 (FR2), the operating frequency of which being above 24 GHz with a channel bandwidth between 50 MHz and 400 MHz. The latter is commonly referred to as millimeter wave (mm-Wave) frequency range. Although the higher operating frequency bands, and mmWave/FR2 in particular, offer the highest data transfer speeds, the transmission distance of such signals may be limited. Furthermore, signals at this frequency range may be unable to penetrate solid obstacles. To overcome these limitations while accommodating more connected devices, various improvements in cell site and mobile device architectures have been developed.

One such improvement is the use of multiple antennas at both the transmission and reception ends, also referred to as MIMO (multiple input, multiple output), which is understood to increase capacity density and throughput. A series of antennas may be arranged in a single or multi-dimensional array, and further, may be employed for beamforming where radio frequency signals are shaped to point in a specified direction of the receiving device. A transmitter circuit feeds the signal to each of the antennas with the phase of the signal as radiated from each of the antennas being varied over the span of the array. The collective signal to the individual antennas may have a narrower beam width, and the direction of the transmitted beam may be adjusted based upon the constructive and destructive interferences from each antenna resulting from the phase shifts. Beamforming may be used in both transmission and reception, and the spatial reception sensitivity may likewise be adjusted. Beamforming presents a spatial selectivity as well.

A typical 5G mm-wave beamformer architecture includes a single RF signal input port and multiple antennas. The transmit signal at the defined carrier frequency is applied to the RF signal input port. The input signal is split into multiple chains using a splitter circuit, and the split portions of the RF input signal are passed to individual transmit chains that may each comprise a phase shifter, a variable gain amplifier, and a power amplifier, the output of which is connected to a single antenna element.

The phase shifter is therefore an important component in 5G mm-Wave New Radio development efforts, and various phase shifter designs are known in the art. Importantly, precise beam shaping and beam steering require very fine phase shift steps, typically via digital control. Five to seven phase shift steps over the entire 360-degree range require 2.8 degrees and 5.6 degrees phase steps. Such level of precision needed in phase shifts at mmWave frequencies has been challenging to implement, particularly with high tolerance and low insertion loss.

Accordingly, there is a need in the art for passive, bi-directional, two-step phase shifters that can effectuate 2.8 degrees and 5.6 degrees control steps with the low bits. There is a need in the art for such phase shifters to operate at mmWave frequencies with low insertion loss. It would also be desirable for such phase shifters to be adaptable to a variety of fabrication technologies, including CMOS (Complementary Metal Oxide Semiconductor), SOI (Silicon on Insulator), and so forth.

BRIEF SUMMARY

Passive two-step phase shifters with stepwise control of 2.8 degrees and 5.6 degrees shifts are presented in accordance with the embodiments of the present disclosure. The phase shifters have low insertion loss and can be utilized in circuits operating in the mmWave frequencies. In one embodiment, the phase shifter may be utilized as a lowest/least significant bit (LSB) block in a chain of additional phase shifters that can effectuate 360-degree shifts with digital control.

In accordance with one embodiment of the present disclosure, there may be a phase shifter with a first port and a second port. The phase shifter may have a center inductor that is electrically connected to the first port and the second port. There may also be a first peripheral inductor that is electromagnetically coupled to the center inductor. Furthermore, the phase shifter may include a second peripheral inductor that is electromagnetically connected to the center inductor. Additionally, there may be a resistor network that includes a plurality of resistors that are electrically connected in series with the first peripheral inductor and the second peripheral inductor. The phase shifter may also include a first transistor switch that is connected in parallel with a first one of the plurality of resistors. There may further be a second transistor switch that is connected in parallel with a second one of the plurality of resistors.

Another embodiment includes a phase shifter with a first port and a second port. The phase shifter may have a triple inductor network that includes a center inductor that is connected to the first port and the second port. The triple inductor network may also have first and second peripheral inductors that are each electromagnetically coupled to the center inductor. The phase shifter may also include a resistance switch network that is connected to the first and second peripheral inductors. The resistance switch network may be selectively activatable to set a first state defined at least by a first resistance in a series circuit with the first and second peripheral inductors, a second state defined at least by a second resistance in the series circuit, and a third state defined at least by a third resistance in the series circuit. A transmission signal from the first port to the second port may be shifted in phase by a prescribed angle corresponding to forward transmission coefficients for the first state, second state, and third state.

The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings.

Common reference numerals are used throughout the drawings and the detailed description to indicate the same elements.

DETAILED DESCRIPTION

The detailed description set forth below in connection with the appended drawings is intended as a description of the several presently contemplated embodiments of low loss, bi-directional, passive least significant bit phase shifters operating at millimeter wave (mmWave) frequencies. It is not intended to represent the only form in which the disclosed invention may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
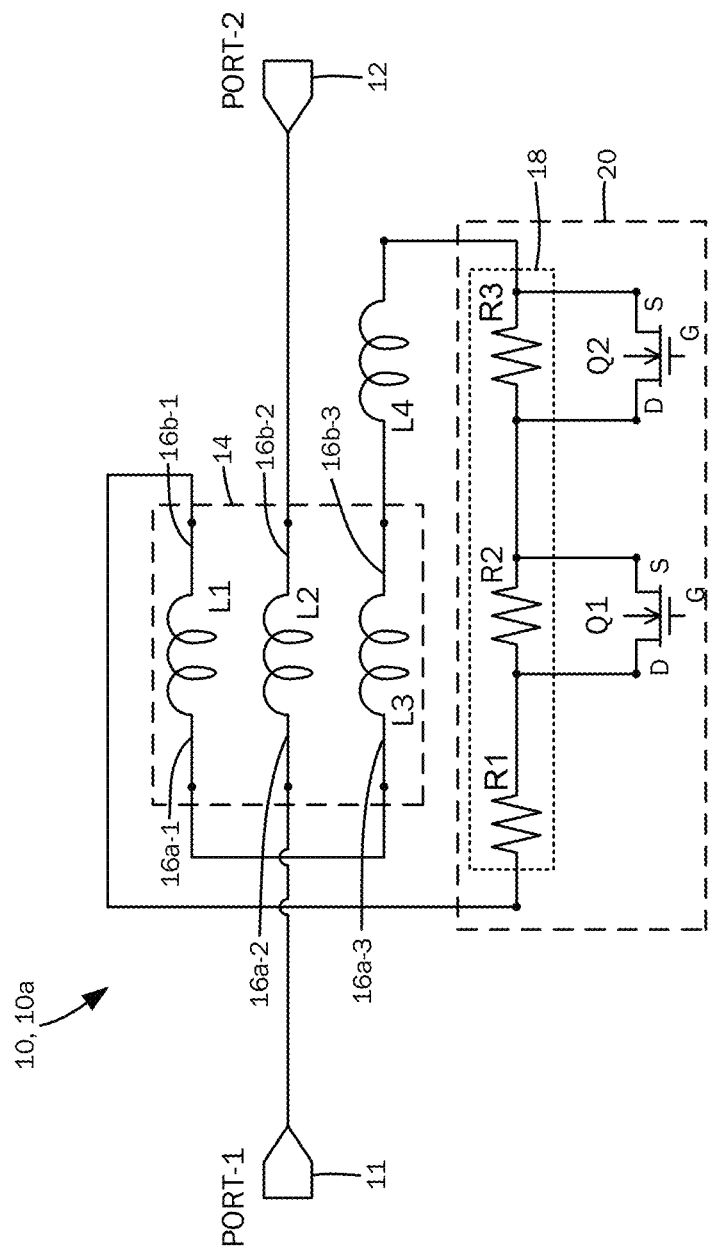
FIG. 1 is a schematic diagram of a first embodiment of a bi-directional phase shifter in accordance with the present disclosure.

With reference to the schematic diagram of FIG. 1, a first embodiment of a bidirectional phase shifter 10a is generally defined by a first port 11 and a second port 12. Being that the phase shifter 10 is bi-directional, the first port 11 may be designated for an input RF (radio frequency) signal while the second port 12 is designated for the output, though the reverse is also true. That is, the second port 12 may be designated for the input RF signal while the first port 11 is designated for the output. Accordingly, reference to the first port 11 accepting an input signal and the second port 12 outputting the phase-adjusted signal is exemplary and made for purposes of consistency only. The phase shifter 10 may therefore be utilized in segments of communications systems that handle both input and output signals.

The first embodiment 10a, as with the other embodiments described in further detail below, are understood to be passive two-step phase shifters that may be controlled with the two least significant bits (LSBs) of a digital or stepped control. The phase shifters 10 may be used to apply 2.8 degrees and 5.6 degrees of phase shift and are envisioned to be adaptable into a broader phase shifter circuit chain capable of applying 360 degrees shift to signals in mmWave frequencies.

The phase shifter 10a includes a triple inductor network 14 that may be comprised of a center inductor L2, a first peripheral inductor L1, and a second peripheral inductor L3. The center inductor L2 is defined by a first terminal 16a-2 that is electrically connected to the first port 11, and a second terminal 16b-2 that is electrically connected to the second port 12. The first peripheral inductor L1 likewise has a first terminal 16a-1 and a second terminal 16b-1, while the second peripheral inductor L2 has a first terminal 16a-3 and a second terminal 16b-3. In one embodiment, the inductors L1, L2, and L3 may be implemented as a series of metallic traces on the semiconductor die and routed to define one or more turns. Such turns of the inductors L1, L2, and L3 of the triple inductor network 14 are understood to be spaced apart from each other, though are electromagnetically coupled. That is, the first peripheral inductor L1 may be electromagnetically coupled to the center inductor L2, and the second peripheral inductor L3 may be electromagnetically coupled to the center inductor L2. Inductors L1 and L3 are also electromagnetically coupled to each other due to final distance between these inductors but coupling coefficient is typically smaller compared with coupling between either L1 and L2 or L3 and L2.

In the illustrated embodiment, the phase shifter 10a includes a resistor network 18 that may be comprised of a first resistor R1, a second resistor R2 connected in series with the first resistor R1, and a third resistor R3 connected in series with the second resistor R2. Generally, the resistor network 18 is connected in series with the triple inductor network 14. More specifically, the first peripheral inductor L1 and the second terminal 16b-1 thereof is connected to the first resistor R1, and the second peripheral inductor L3 and the second terminal 16b-3 thereof is connected to the third resistor R3. As shown, there may also be an interconnection inductor L4 interposed between the third resistor R3 and the second terminal 16b-3 of the second peripheral inductor L3.

The phase shifter 10a may also include a first transistor Q1 that is connected in parallel to the second resistor R2, as well as a second transistor Q2 that is connected in parallel to the third resistor R3. In the illustrated first embodiment of the phase shifter 10a, the transistors Q1, Q2 are contemplated to be field effect transistors that have a gate terminal, a drain terminal, and a source terminal. The field effect transistors are understood to be metal oxide semiconductor field effect transistors (MOSFETs). In the illustrated example, the transistors Q1, Q2 are of the N-type, that is, having an n-type drain and source, and a p-type substrate. This is by way of example only and not of limitation, and P-type transistors may be substituted if desired. Moreover, the specific fabrication technology need not be limited to metal oxide semiconductor, and any other suitable transistor type may be substituted.

When referring to the transistors being connected in parallel to the resistors, it is understood that the drain terminal is connected to a first one of the terminals of the resistor, while the source terminal is connected to a second one of the terminals of the resistor. Thus, in an exemplary embodiment, the drain terminal of the first transistor Q1 is connected to a first one of the terminals of the second resistor R2, and the source terminal of the first transistor Q1 is connected to the other one of the terminals of the second resistor R2. The drain terminal of the second transistor Q2 is electrically contiguous/connected to the source terminal of the first transistor Q1, along with the second one of the terminals of the second resistor R2 and the first one of the terminals of the third resistor R3. The source terminal of the second transistor Q2 is connected to the second one of the terminals of the third resistor R3. The interconnection inductor L4 is connected to the second terminal 16b-3 of the second peripheral inductor L3, along with the source terminal of the second transistor Q2 and the second one of the terminals of the third resistor R3.

The triple inductor network 14 also defines a series connection of the first peripheral inductor L1 and the second peripheral inductor L3. As such, the first terminal 16a-1 of the first peripheral inductor L1 is connected to the first terminal 16a-3 of the second peripheral inductor L3.

The embodiments of the present disclosure contemplate the use of the triple inductor network 14 and the particular electromagnetic coupling between the peripheral inductors and the center inductor L2 to effectuate different phase shifts to a signal traversing the center inductor L2. The coupling between the inductors is envisioned to result in a partial cancellation of the magnetic flux therein and minimize self-inductance, while different resistance values, as well as certain capacitances per alternative embodiments, are selectively connected. The selective connection of the resistors R1, R2, and R3 of the resistor network 18 may be controlled by the transistors Q1 and Q2, which can in turn be digitally controlled to set various states that correspond to phase shift steps. The transistors Q1 and Q2 may, in turn, be selectively activated and deactivated with suitable control signals applied to the gate terminals thereof.

Figure 2A:
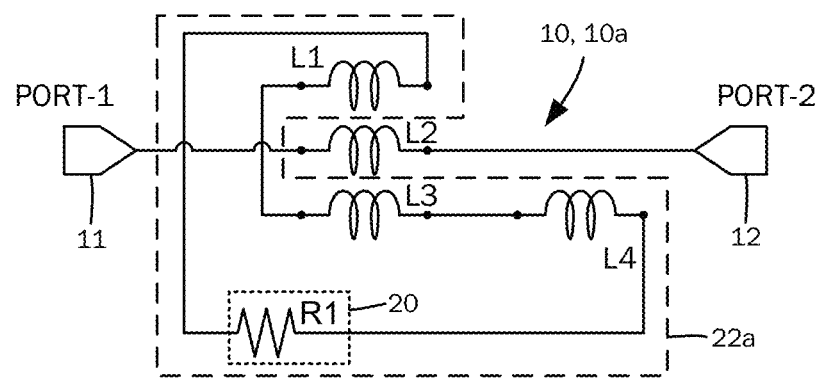
FIG. 2A is a schematic diagram of an equivalent circuit of the first embodiment of the bi-directional phase shifter shown in FIG. 1, in a first state.
Figure 2B:
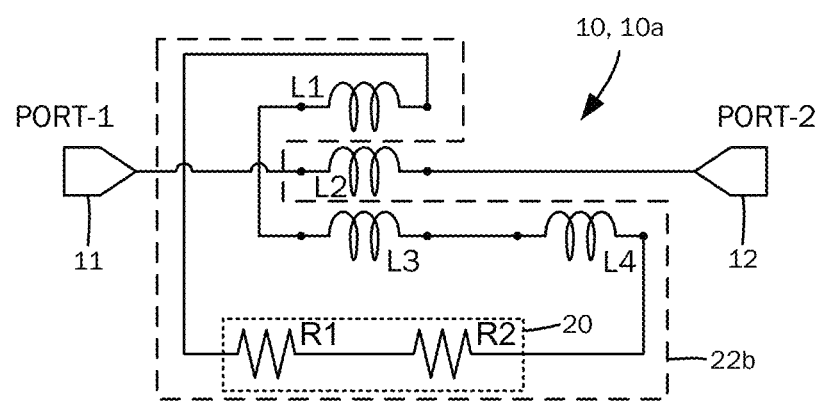
FIG. 2B is a schematic diagram of an equivalent circuit of the first embodiment of the bi-directional phase shifter in a second state.
Figure 2C:
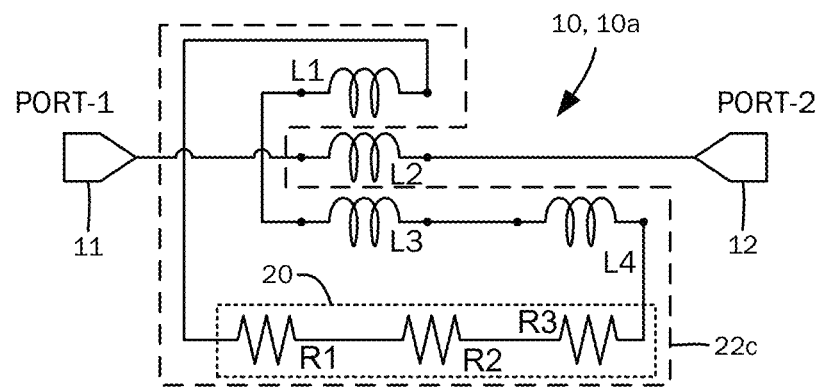
FIG. 2C is a schematic diagram of an equivalent circuit of the first embodiment of the bi-directional phase shifter in a third state.

The resistors R1, R2, and R3, together with the first transistor Q1 and the second transistor Q2 may therefore be referenced in the aggregate as a resistance switch network 20. The aforementioned triple inductor network 14 is connected to the resistance switch network 20, such that different states are selectively activatable therewith. FIGS. 2A-2C illustrate three such possible states with the transistors Q1 and Q2 being in various activated and deactivated conditions.

FIG. 2A in particular illustrates a first state in which the first transistor Q1 and the second transistor Q2 are both activated. In this condition, the resistors R2 and R3 are both shunted by the respective transistors Q1 and Q2 connected in parallel thereto, with the transistors providing a low resistance, e.g., less than 5 Ohm. The resistance that is part of the series circuit 22a of the first peripheral inductor L1, the second peripheral inductor L3, the interconnection inductor L4, and the resistance switch network 20 is thus the first resistor R1. The RF signal input to the first port 11 is phase-shifted by a prescribed angle that corresponds to the angular forward transmission coefficient (S21) of the phase shifter 10a in this first state, and output from the second port 12. In accordance with various embodiments of the present disclosure, because the phase shifter 10a is bi-directional, the same RF signal applied to the second port 12 is understood to be shifted by the same degree and output from the first port 11.

FIG. 2B illustrates a second state in which the first transistor Q1 is deactivated and the second transistor Q1 is activated. In this condition, the third resistor R3 is shunted by the transistor Q2, but the second resistor R2 is not. The activated second transistor Q2 again contributes a low resistance, e.g., less than 5 Ohm, while the deactivated second transistor Q1 contributes a very high resistance, e.g., greater than 1 k Ohm. The resistance that is part of the series circuit 22b of the first peripheral inductor L1, the second peripheral inductor L3, the interconnection inductor L4, and the resistance switch network 20 is the first resistor R1 as in the first state, as well as the second resistor R2. The RF signal input to the first port 11 is phase shifted by another prescribed angle that corresponding to the angular forward transmission coefficient (S21) of the phase shifter 10a in this second state, and output from the second port 12. Again, with the phase shifter 10a being bi-directional, the RF signal applied to the second port 12 may be shifted by the same degree and output from the first port 11 when otherwise in this second state. According to various embodiments of the present disclosure, the resultant angular difference between the forward transmission coefficient S21 with the resistance switch network 20 in the first state and the forward transmission coefficient S21 with the resistance switch network 20 in the second state is contemplated to be 2.8 degrees.

FIG. 2C illustrates a third state in which both the first transistor Q1 and the second transistor Q2 are deactivated. In this condition, neither the second resistor R2 nor the third resistor R3 are shunted, with Q1 and Q2 both providing a very high resistance, e.g., greater than 1 k Ohm. The resistance that is part of the series circuit 22c of the first peripheral inductor L1, the second peripheral inductor L2, the interconnection inductor L4, and the resistance switch network 20 is the first resistor R1, the second resistor R2, and the third resistor R3. The RF signal input to the first port 11 is phase shifted by yet another prescribed angle that corresponds to the angular forward transmission coefficient (S21) of the phase shifter 10a in this third state, and output from the second port 12. As indicated above, the RF signal applied to the second port 12 may be shifted by the same degree and output from the first port 11 when in this third state. The resultant angular difference between the forward transmission coefficient S21 with the resistance switch network 20 in the third state may be another 2.8 degrees relative to the second state, or a total of 5.6 degrees relative to the first state. Targeting a 2.8 degrees relative phase shift may also be achieved by switching between the second state and the third state, together with the appropriate switching of the transistors Q1, Q2.

The foregoing description of setting the third state is exemplary only, and other modalities for achieving the same are contemplated. For example, the first transistor Q1 may be activated to provide a very low resistance, while deactivating the second transistor Q2 to provide a very high resistance. The values of the second resistor R2 and the third resistor R3 may be modified accordingly, such that the value of the third resistor R3 in this variation is equivalent to the combined resistances of the second resistor R2 and the third resistor R3 in the first variation considered above.

It is also possible to configure the phase shifter 10a for a single phase shift value. Providing only a single resistor and corresponding parallel transistor in the resistance switch network 20 is understood to enable the activation and deactivation of one phase shift degree, depending on the value of the resistor that is selectively shunted. There could be one block to selectively apply a 2.8 degrees phase shift, and another block to selectively apply a 5.6 degrees phase shift.

The phase shifter 10, and the various components thereof considered above may be fabricated on a semiconductor die in accordance with various embodiments of the present disclosure. As illustrated in the schematic diagrams, no RF ground is required so the phase shifters 10a can occupy minimal on-die real estate and accordingly reduce the size of the overall RF circuit solution. The first resistor R1 need not necessarily be a separate resistor on such semiconductor die and may constitute metallic trace losses associated with the interconnection circuitry of the phase shifter 10. The specific values of the components may vary, though it is understood that such values may depend primarily on the coupling coefficients between the different inductor L1, L2, and L3 of the triple inductor network 14. Furthermore, the component values may vary depending on the specifics of the semiconductor fabrication and technology node that is utilized. The following simulated performance results of the phase shifter 10a are based upon certain predetermined coupling coefficient values, and a change thereto is understood to require a different set of values for each of the other components of the circuit.

In the following simulation, the center inductor L2, the first peripheral inductor L1, and the second peripheral inductor L2 each have an inductance value of 150 pH, as well as a resistance of 3 Ohm for each L1, L2 and L3. The coupling factor of the first peripheral inductor L1 and the center inductor L2 (e.g., K1_2, as well as the coupling factor of the center inductor L2 and the second peripheral inductor L3 (e.g., K2_3) is 0.9. The coupling factor of the first peripheral inductor L1 and the second peripheral inductor L3 is set to 0.7. The interconnection inductor L4 is set to 40 pH. This operating frequency range is chosen to be between 24.25 GHz and 29.5 GHz, which covers several F2 frequency bands for 5G mmWave NR systems.

Figure 3:
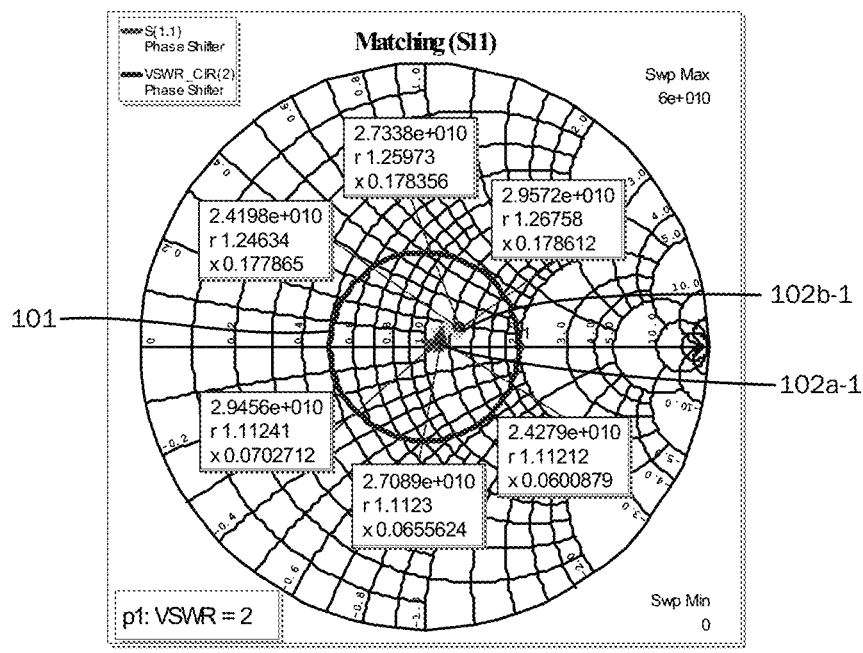
FIG. 3 is a Smith chart plotting the simulated input reflection coefficients/input return loss (S11) of the first embodiment of the bi-directional phase shifter in the first state and the second state.

The Smith chart of FIG. 3 plots the simulated input reflection coefficients/input return loss (S11) of the first embodiment of the phase shifter 10a in the first and second states. In the exemplary configuration, the least significant bit is set to apply a 2.8 degrees phase shift. The first plot 101 represents a reference voltage standing wave ratio (VSWR) of 2:1, where S11 is −10 dB. A plot 102a-1 shows the input return loss S11 of the phase shifter 10a in the first state, which can be compared to a plot 102b-1 of the input return loss S11 of the phase shifter 10a in the second state.

Figure 4A:
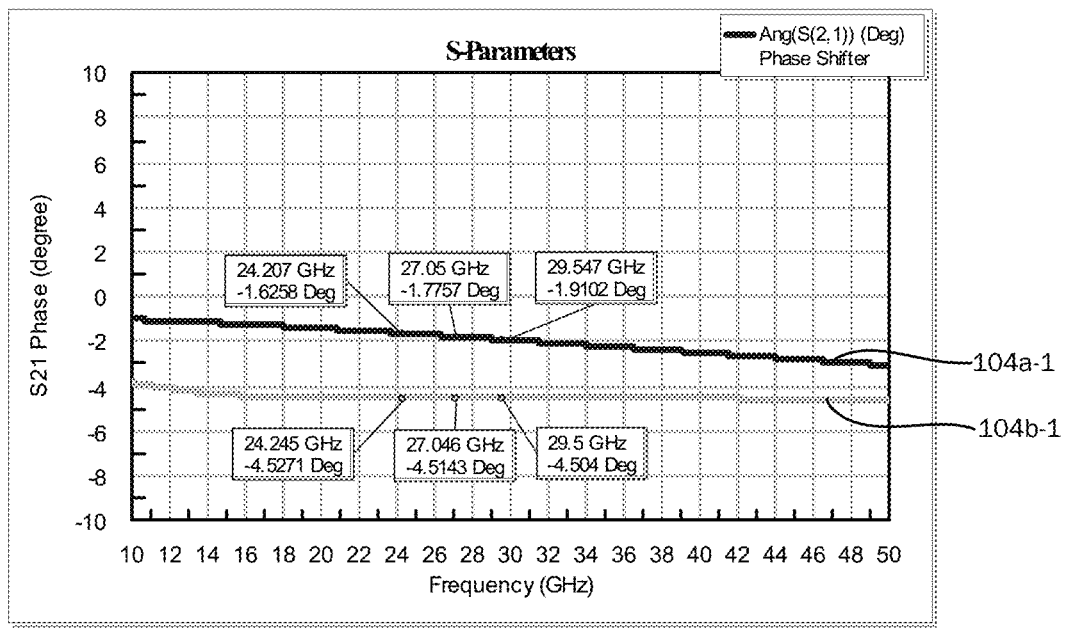
FIG. 4A is a graph plotting a sweep of simulated angular/phase components of forward transmission coefficients (S21) of the first embodiment of the bi-directional phase shifter in the first state and the second state over a frequency range.
Figure 4B:
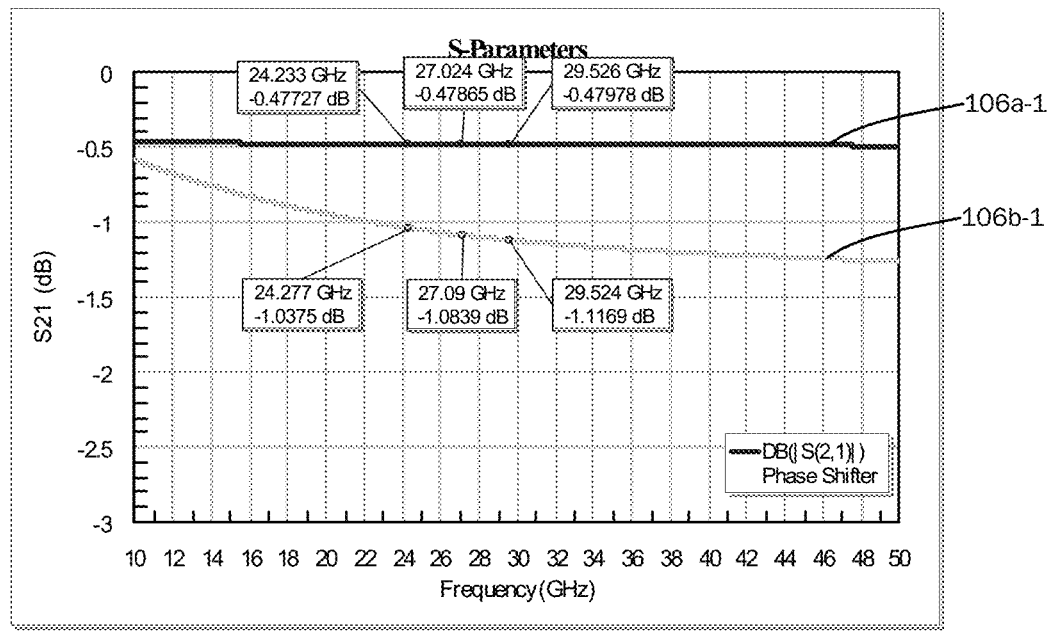
FIG. 4B is a graph plotting a sweep of simulated amplitude components of forward transmission coefficients (S21) of the first embodiment of the bi-directional phase shifter in the first state and the second state over a frequency range.
Figure 4C:
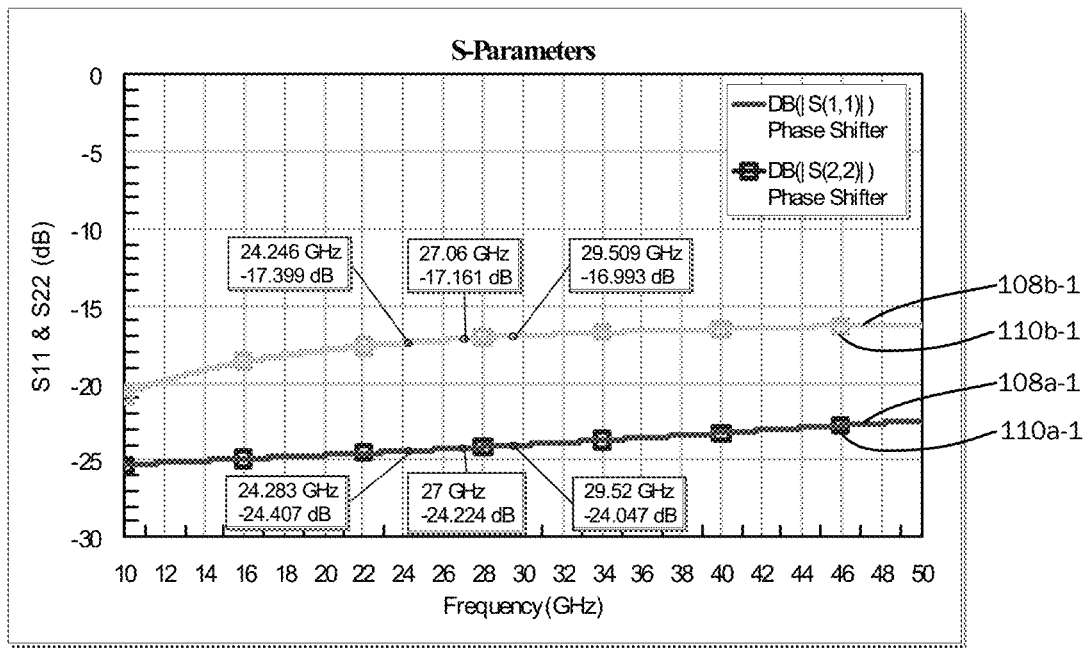
FIG. 4C is a graph plotting a sweep of simulated input/output return losses (S11, S22) of the first embodiment of the bi-directional phase shifter in the first state and the second state over a frequency range.

The graphs of FIGS. 4A, 4B, and 4C plot the simulated scattering parameters (S-parameters) of the first embodiment of the phase shifter 10a across a sweep of operating frequencies with it being in the first and second states. In particular, the graph of FIG. 4A shows a plot 104a-1 and a plot 104b-1 of the simulated angular components of the forward transmission coefficient (S21), that is, the phase shift angle (in degrees) that are applied to an RF input signal to the first port 11 and output at the second port 12. The plot 104a-1 is when the first embodiment of the phase shifter 10a is set to the first state, whereas the plot 104b-1 is when the first embodiment of the phase shifter 10a is set to the second state. Differences between the values along the plot 104a-1 and the plot 104b-1 for a given frequency range yields the relative phase shifts that are effectuated upon the RF signal from the first state to the second state, referred to as the angle delta.

The graph of FIG. 4B shows a plot 106a-1 and a plot 106b-1 of the simulated amplitude components of the forward transmission coefficient (S21), that is, the loss or attenuation of a signal applied to an RF input signal to the first port 11 and output at the second port 12. The plot 106a-1 is when the first embodiment of the phase shifter 10a is set to the first state, and the plot 106b-1 is when the first embodiment of the phase shifter 10a is set to the second state. Differences between the values along the plot 106a-1 and the plot 106b-1 for a given frequency range yields the relative loss or attenuation of the RF signal from the first state to the second state, referred to as the loss delta.

The graph of FIG. 4C shows a plot 108a-1 and a plot 108b-1 of the simulated first port reflection coefficient (S11) or input return loss when the first embodiment of the phase shifter 10a is in the first state and the second state, respectively. There is additionally a plot 110a-1 and a plot 110b-1 of the simulated second port reflection coefficient (S22) or input return loss when the first embodiment of the phase shifter 10a is in the first state and the second state, respectively. The plots 108 are for the input RF signal being applied to the first port 11, whereas the plots 110 are for the input RF signal being applied to the second port 12.

The following table 1 summarizes the simulated performance of the first embodiment of the phase shifter 10a when in the first state and the second state, corresponding to the target phase shift of 2.8 degrees. The simulated values are organized according to the discrete 5G mmWave operating frequencies of 24.24 GHz, 27.0 GHz, and 29.5 GHz, with the actual computed values being those that of frequencies closest thereto. The values of the first resistor R1, the second resistor R2, and the third resistor R3 utilized for this simulation are also provided.

TABLE 1

|  | 24.25 GHz | 27.0 GHz | 29.5 GHz |
| --- | --- | --- | --- |
| Target shift (degrees) |  | 2.8 |  |
| Angle delta, (degrees) | 2.9 | 2.74 | 2.59 |
| Loss delta (dB) | 0.56 | 0.61 | 0.64 |
| Max S11 (dB) | −17.4 | −17.16 | −16.99 |
| Max loss (dB) | −1.04 | −1.08 | −1.12 |
| R1 (Ohm) |  | 5 |  |
| R2 (Ohm) |  | 50 |  |
| R3 (Ohm) |  | 0 |  |

Of note, it is envisioned that there be only a small variation in phase shift from the 2.8 degrees target, and more specifically, specifically less than +0.1 degrees or −0.21 degrees of variation. Furthermore, there is understood to be less than 0.64 dB variation with respect to the forward transmission coefficient/signal attenuation S21 across the full frequency band. According to the simulation, there is a low maximum insertion loss of less than 1.12 dB across the full frequency band. Furthermore, the worst-case input return loss (S11) appears to be less than −17 dB across the full frequency band.

Figure 5:
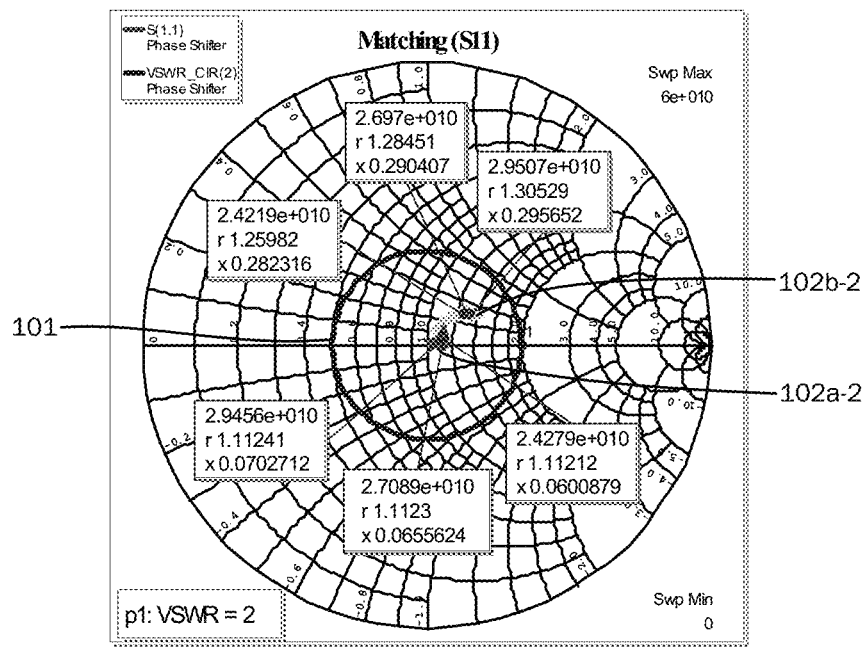
FIG. 5 is a Smith chart plotting the simulated input reflection coefficients/input return loss (S11) of the first embodiment of the bi-directional phase shifter in the first state and the third state.

The Smith chart of FIG. 5 plots the simulated input reflection coefficients/input return loss (S11) of the first embodiment of the phase shifter 10a in the first and third states. In the exemplary configuration, the least significant bit is set to apply a 5.6 degrees phase shift. The first plot 101 represents a reference voltage standing wave ratio (VSWR) of 2:1, where S11 is −10 dB. A plot 102a-2 shows the input return loss S11 of the phase shifter 10a in the first state, which can be compared to a plot 102b-2 of the input return loss S11 of the phase shifter 10a in the third state.

Figure 6A:
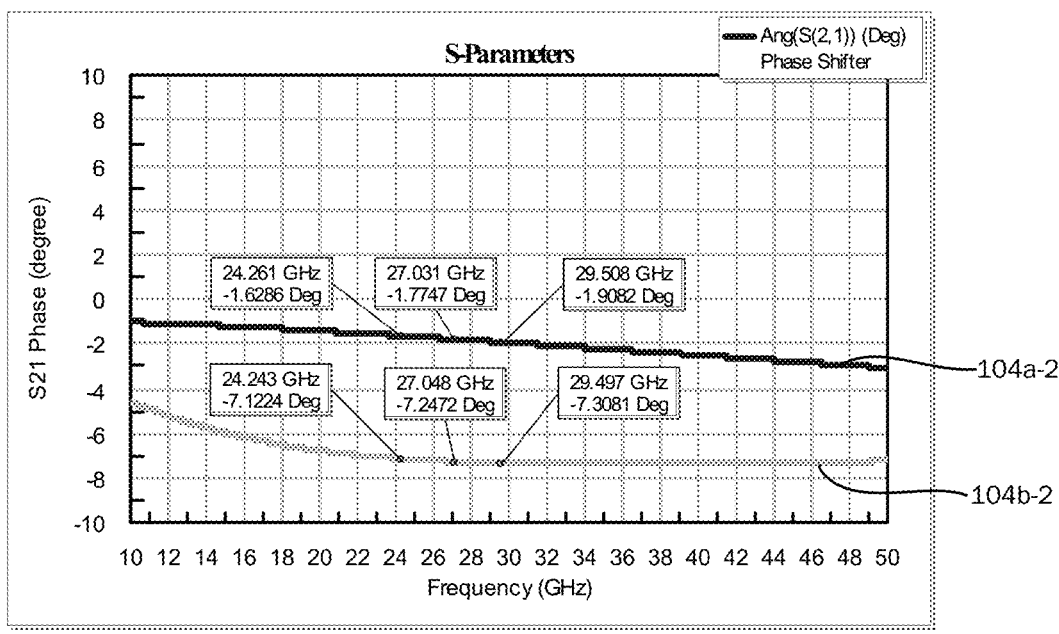
FIG. 6A is a graph plotting a sweep of simulated angular/phase components of forward transmission coefficients (S21) of the first embodiment of the bi-directional phase shifter in the first state and the third state over a frequency range.
Figure 6B:
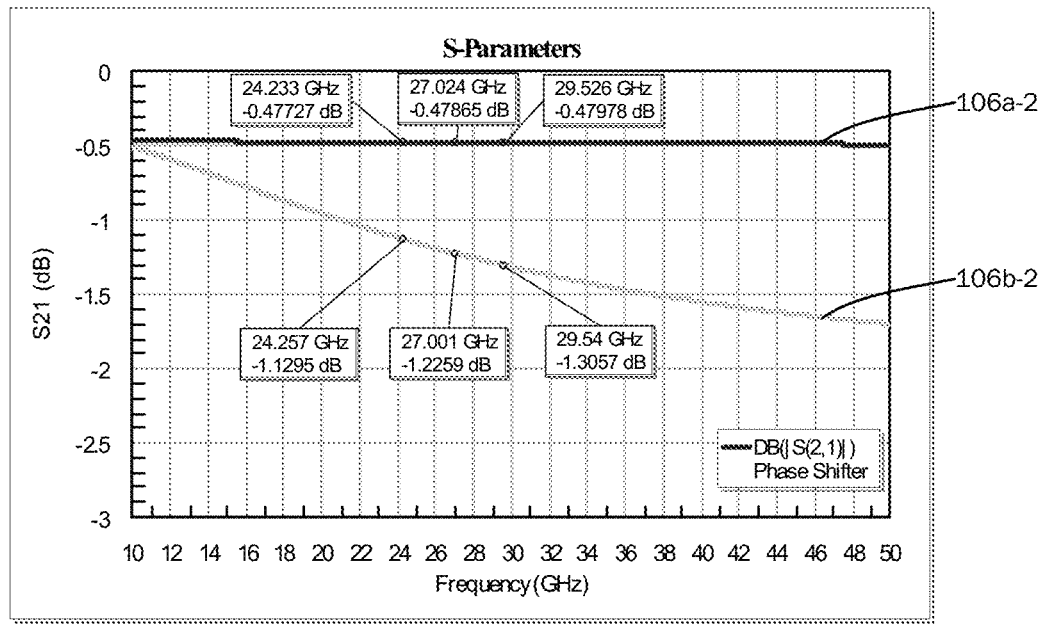
FIG. 6B is a graph plotting a sweep of simulated amplitude components of forward transmission coefficients (S21) of the first embodiment of the bi-directional phase shifter in the first state and the third state over a frequency range.
Figure 6C:
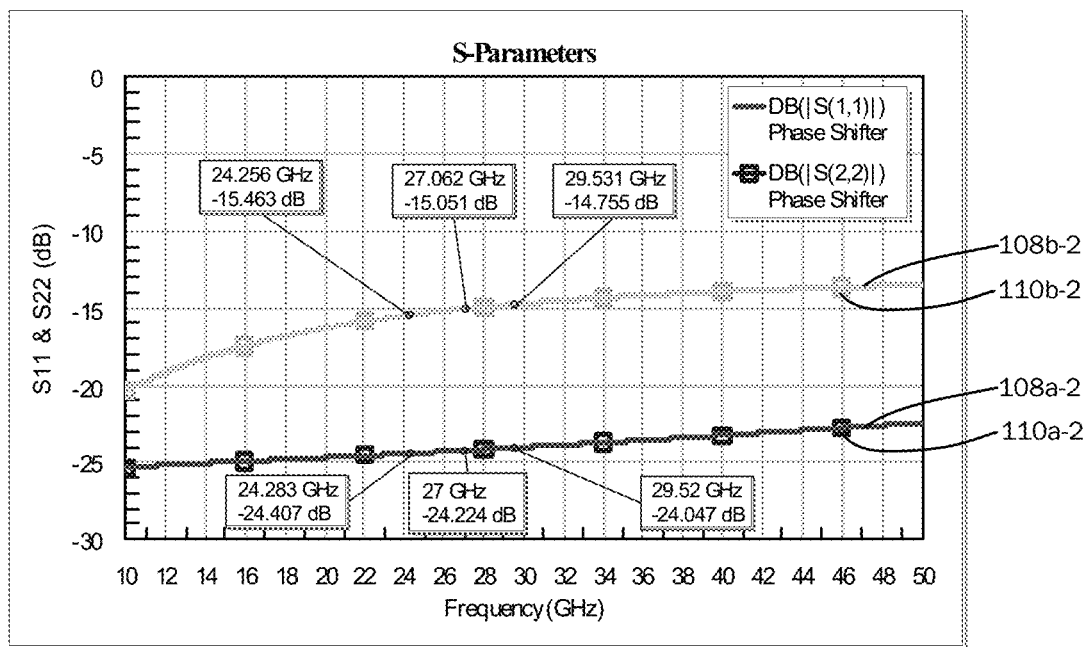
FIG. 6C is a graph plotting a sweep of simulated input/output return losses (S11, S22) of the first embodiment of the bi-directional phase shifter in the first state and the third state over a frequency range.

The graphs of FIGS. 6A, 6B, and 6C plot the simulated scattering parameters (S-parameters) of the first embodiment of the phase shifter 10a across a sweep of operating frequencies with it being in the first and third states. The graph of FIG. 6A shows a plot 104a-2 and a plot 104b-2 of the simulated angular components of the forward transmission coefficient (S21), that is, the phase shift angle (in degrees) that are applied to an RF input signal to the first port 11 and output at the second port 12. The plot 104a-2 is when the first embodiment of the phase shifter 10a is set to the first state, and the plot 104b-2 is when the first embodiment of the phase shifter 10a is set to the third state. Differences between the values along the plot 104a-2 and the plot 104b-2 for a given frequency range yields the relative phase shifts that are effectuated upon the RF signal from the first state to the third state, referred to as the angle delta.

The graph of FIG. 6B shows a plot 106a-2 and a plot 106b-2 of the simulated amplitude components of the forward transmission coefficient (S21), that is, the loss or attenuation of a signal applied to an RF input signal to the first port 11 and output at the second port 12. The plot 106a-2 is when the first embodiment of the phase shifter 10a is set to the first state, and the plot 106b-2 is when the first embodiment of the phase shifter 10a is set to the third state. Differences between the values along the plot 106a-2 and the plot 106b-2 for a given frequency range yields the relative loss or attenuation of the RF signal from the first state to the third state, referred to as the loss delta.

The graph of FIG. 6C shows a plot 108a-2 and a plot 108b-2 of the simulated first port reflection coefficient (S11) or input return loss when the first embodiment of the phase shifter 10a is in the first state and the third state, respectively. There is additionally a plot 110a-2 and a plot 110b-2 of the simulated second port reflection coefficient (S22) or input return loss when the first embodiment of the phase shifter 10a is in the first state and the third state, respectively. The plots 108 are for the input RF signal being applied to the first port 11, whereas the plots 110 are for the input RF signal being applied to the second port 12.

The following table 2 summarizes the simulated performance of the first embodiment of the phase shifter 10a when in the first state and the third state, corresponding to the target phase shift of 5.6 degrees. Again, the simulated values are organized according to the discrete 5G mmWave operating frequencies of 24.24 GHz, 27.0 GHz, and 29.5 GHz, with the actual computed values being those that of frequencies closest thereto. The values of the first resistor R1, the second resistor R2, and the third resistor R3 utilized for this simulation are also provided.

TABLE 2

|  | 24.25 GHz | 27.0 GHz | 29.5 GHz |
| --- | --- | --- | --- |
| Target shift (degrees) |  | 5.6 |  |
| Angle delta, (degrees) | 5.49 | 5.47 | 5.4 |
| Loss delta (dB) | 0.65 | 0.75 | 0.83 |
| Max S11 (dB) | −15.46 | −15.05 | −14.75 |
| Max loss (dB) | −1.13 | −1.23 | −1.31 |
| R1 (Ohm) |  | 5 |  |
| R2 (Ohm) |  | 50 |  |
| R3 (Ohm) |  | 40 |  |

It is envisioned that there be only a small variation in phase shift from the 5.6 degrees target, and more specifically, specifically less than −0.2 degrees of variation. There is understood to be less than 0.83 dB variation with respect to the forward transmission coefficient/signal attenuation S21 across the full frequency band. According to the simulation, there is a low maximum insertion loss of less than 1.31 dB across the full frequency band. Furthermore, the worst-case input return loss (S11) appears to be less than −14 dB across the full frequency band.

The following table 3 summarizes the simulated performance of the first embodiment of the phase shifter 10a, with the aforementioned alternative configuration in which there is only a single transistor/resistor for the 5.6 degrees phase shift step.

TABLE 3

|  | 24.25 GHz | 27.0 GHz | 29.5 GHz |
| --- | --- | --- | --- |
| Target shift (degrees) |  | 5.6 |  |
| Angle delta, (degrees) | 5.49 | 5.47 | 5.4 |
| Loss delta (dB) | 0.65 | 0.75 | 0.83 |
| Max S11 (dB) | −15.46 | −15.05 | −14.75 |
| Max loss (dB) | −1.13 | −1.23 | 1.31 |
| R1 (Ohm) |  | 5 |  |
| R2 (Ohm) |  | 0 |  |
| R3 (Ohm) |  | 90 |  |

The following table 4 summarizes the simulated performance of the first embodiment of the phase shifter 10a when it is operated to effectuate a 2.8 degrees phase shift from the second state to the third state. In this operation, it is contemplated to exhibit a low loss delta of less than 0.19 dB across the entire frequency band for the 2.8 degrees phase shifter segment, while also maintain a low phase shift delta of less than 0.2 degrees across the full frequency band.

TABLE 4

|  | 24.25 GHz | 27.0 GHz | 29.5 GHz |
| --- | --- | --- | --- |
| Target shift (degrees) |  | 2.8 |  |
| Angle delta, (degrees) | 2.6 | 2.73 | 2.8 |
| Loss delta (dB) | 0.09 | 0.14 | 0.19 |
| Max S11 (dB) | −15.46 | −15.05 | −14.75 |
| Max loss (dB) | −1.13 | −1.23 | −1.31 |
| R1 (Ohm) |  | 5 |  |
| R2 (Ohm) |  | 50 |  |
| R3 (Ohm) |  | 4 |  |

Figure 7:
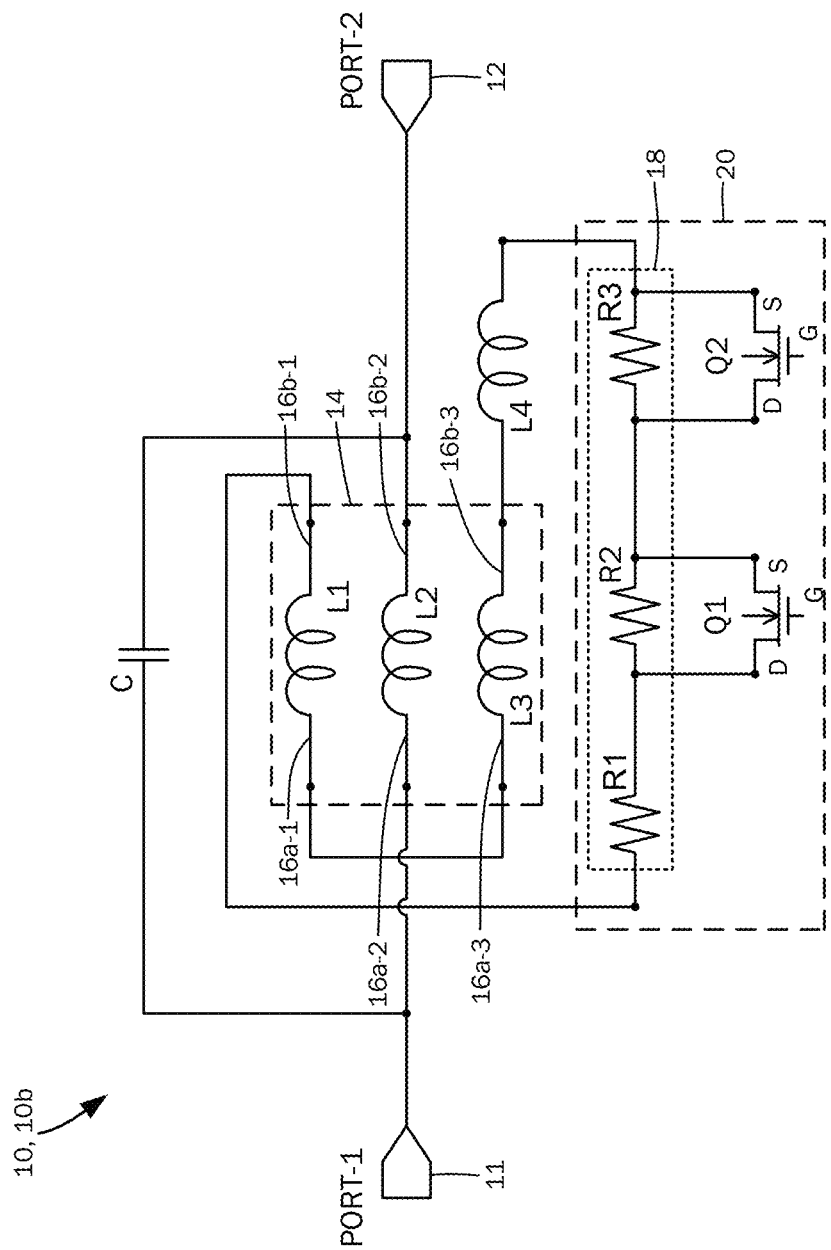
FIG. 7 is a schematic diagram of a second embodiment of a bi-directional phase shifter in accordance with the present disclosure.

Turning now to the schematic diagram of FIG. 7, a second embodiment of the bidirectional phase shifter 10b again incorporates the first port 11 and the second port 12, either of which may serve as an RF signal input or an output, and vice versa. The second embodiment of the phase shifter 10b, as with the first embodiment 10a considered above and the other embodiments described herein, are passive two-step phase shifters that may be controlled with the two least significant bits (LSBs) of a digital or stepped control. Thus, the phase shifter 10b is contemplated to be used to apply 2.8 degrees and 5.6 degrees of phase shift to signals in mmWave frequencies. The second embodiment 10b, however, incorporates an additional capacitor connected to the first port 11 and the second port 12, as will be described more fully below.

The phase shifter 10b includes the same triple inductor network 14 comprised of the center inductor L2, the first peripheral inductor L1, and the second peripheral inductor L3. The center inductor L2 is defined by the first terminal 16a-2 that is electrically connected to the first port 11, and the second terminal 16b-2 that is electrically connected to the second port 12. The first peripheral inductor L11 has the first terminal 16a-1 and the second terminal 16b-1, while the second peripheral inductor L2 has the first terminal 16a-3 and the second terminal 16b-3. The first peripheral inductor L1 is understood to be electromagnetically coupled to the center inductor L2, and the second peripheral inductor L3 is understood to be electromagnetically coupled to the center inductor L2. The Inductors L1 and L3 are also electromagnetically coupled to each other due to final distance between these inductors but coupling coefficient is typically smaller compared with coupling between either L1 and L2 or L3 and L2.

The second embodiment of the phase shifter 10b includes the same resistor network 18 comprised of the first resistor R1, the second resistor R2 connected in series with the first resistor R1, and the third resistor R3 connected in series with the second resistor R2. The resistor network 18 is connected in series with the triple inductor network 14, with the first peripheral inductor L1 and the second terminal 16b-1 thereof being connected to the first resistor R1, and the second peripheral inductor L3 and the second terminal 16b-3 thereof being connected to the third resistor R3. The interconnection inductor L4 may be interposed between the third resistor R3 and the second terminal 16b-3 of the second peripheral inductor L3.

The phase shifter 10b further incorporates the first transistor Q1 that is connected in parallel to the second resistor R2, as well as the second transistor Q2 that is connected in parallel to the third resistor R3. In an exemplary embodiment, the drain terminal of the first transistor Q1 is connected to a first one of the terminals of the second resistor R2, and the source terminal of the first transistor Q1 is connected to the other one of the terminals of the second resistor R2. The drain terminal of the second transistor Q2 is electrically contiguous/connected to the source terminal of the first transistor Q1, along with the second one of the terminals of the second resistor R2 and the first one of the terminals of the third resistor R3. The source terminal of the second transistor Q2 is connected to the second one of the terminals of the third resistor R3. The interconnection inductor L4 is connected to the second terminal 16b-3 of the second peripheral inductor L3, along with the source terminal of the second transistor Q2 and the second one of the terminals of the third resistor R3. The triple inductor network 14 also defines a series connection of the first peripheral inductor L1 and the second peripheral inductor L3. The first terminal 16a-1 of the first peripheral inductor L1 is therefore connected to the first terminal 16a-3 of the second peripheral inductor L3.

The second embodiment of the phase shifter 10b additionally incorporates a capacitor C that is connected across the center inductor L2, that is, from the first port 11 to the second port 12. In other words, the first terminal 16a-2 of the center inductor L2 is also connected to a first one of the terminals of the capacitor C, and the second terminal 16b-2 is also connected to a second one of the terminals of the capacitor C.

The triple inductor network 14 and the particular electromagnetic coupling between the peripheral inductors and the center inductor L2 is contemplated to effectuate different phase shifts to a signal traversing the center inductor L2. The selective connection of the resistors R1, R2, and R3 of the resistor network 18 is controlled by the transistors Q1 and Q2. The resistance switch network 20, which includes the resistors R1, R2, and R3, as well as the first transistor Q1 and the second transistor Q2, is connected to the triple inductor network 14, such that different states are selectively activatable.

Figure 8A:
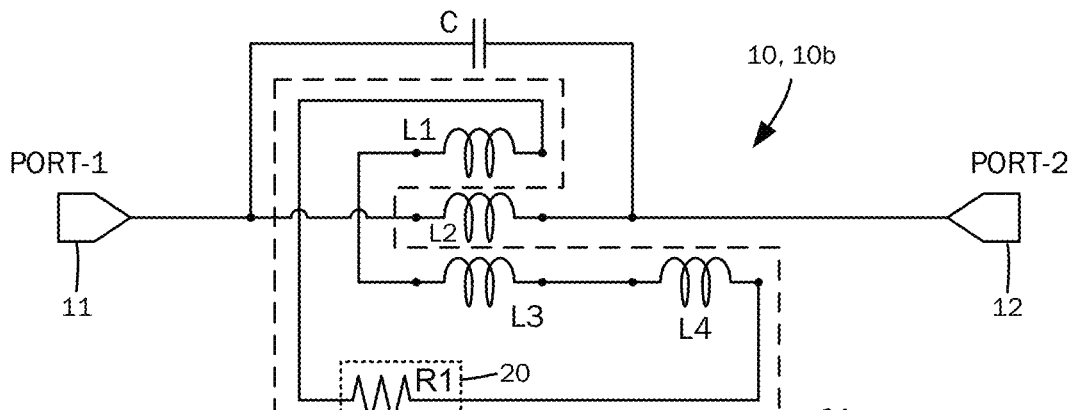
FIG. 8A is a schematic diagram of an equivalent circuit of the second embodiment of the bi-directional phase shifter shown in FIG. 7, in a first state.
Figure 8B:
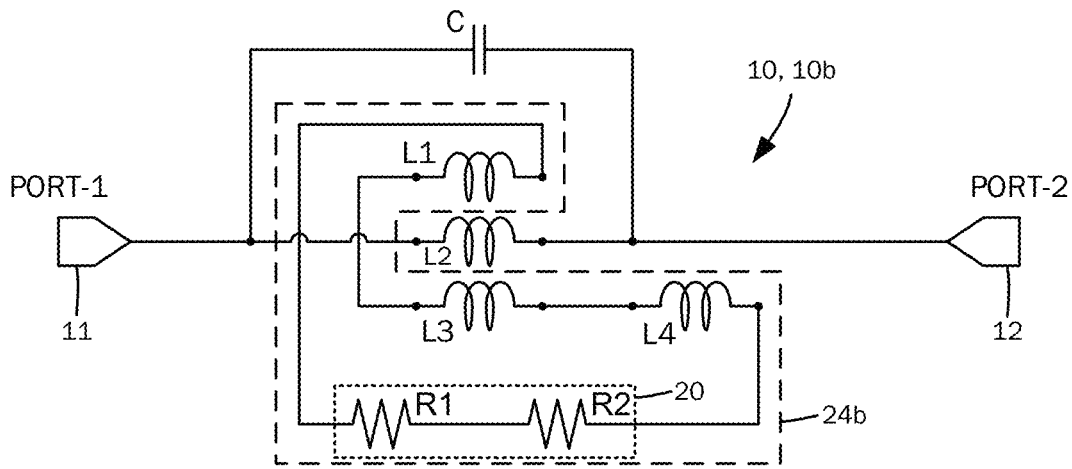
FIG. 8B is a schematic diagram of an equivalent circuit of the second embodiment of the bi-directional phase shifter in a second state.
Figure 8C:
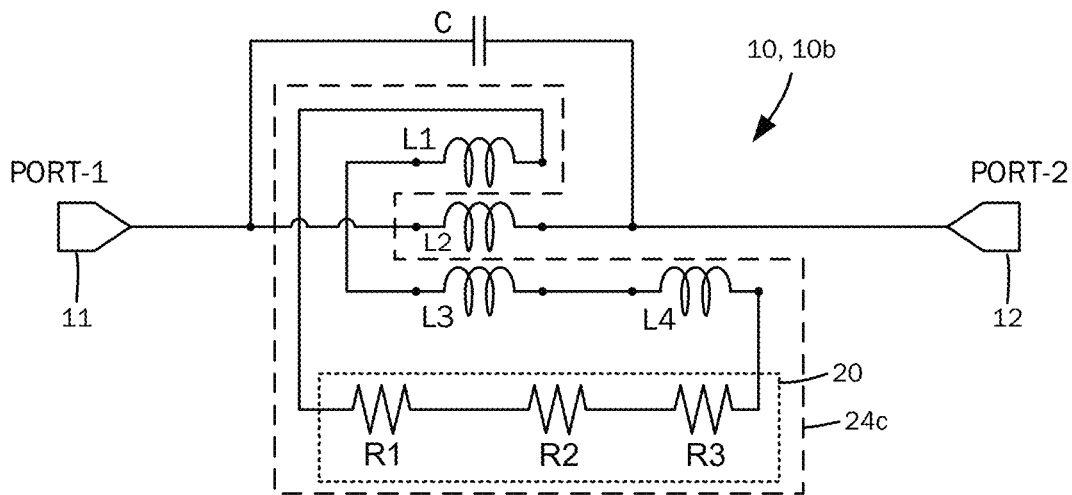
FIG. 8C is a schematic diagram of an equivalent circuit of the second embodiment of the bi-directional phase shifter in a third state.

FIGS. 8A-8C illustrate three such possible states with the transistors Q1 and Q2 being in various activated and deactivated conditions. FIG. 8A illustrates the first state in which the first transistor Q1 and the second transistor Q2 are both activated. In this condition, the resistors R2 and R3 are both shunted by the respective transistors Q1 and Q2 connected in parallel thereto, with the transistors providing a low resistance, e.g., less than 5 Ohm. The resistance that is part of the series circuit 24a of the first peripheral inductor L1, the second peripheral inductor L3, the interconnection inductor L4, and the resistance switch network 20 is thus the first resistor R1. The RF signal input to the first port 11 is phase-shifted by a prescribed angle that corresponds to the angular forward transmission coefficient (S21) of the phase shifter 10b in this first state, and output from the second port 12. In accordance with various embodiments of the present disclosure, because the phase shifter 10b is bi-directional, the same RF signal applied to the second port 12 is understood to be shifted by the same degree and output from the first port 11.

FIG. 8B illustrates the second state in which the first transistor Q1 is deactivated and the second transistor Q1 is activated. In this condition, the third resistor R3 is shunted by the transistor Q2, but the second resistor R2 is not. The activated second transistor Q2 again contributes a low resistance, e.g., less than 5 Ohm, while the deactivated second transistor Q1 contributes a very high resistance, e.g., greater than 1 k Ohm. The resistance that is part of the series circuit 24b of the first peripheral inductor L1, the second peripheral inductor L3, the interconnection inductor L4, and the resistance switch network 20 is the first resistor R1 as in the first state, as well as the second resistor R2. The RF signal input to the first port 11 is phase shifted by another prescribed angle that corresponding to the angular forward transmission coefficient (S21) of the phase shifter 10b in this second state, and output from the second port 12. Again, with the phase shifter 10 being bi-directional, the RF signal applied to the second port 12 may be shifted by the same degree and output from the first port 11 when otherwise in this second state. The resultant angular difference between the forward transmission coefficient S21 with the resistance switch network 20 in the first state and the forward transmission coefficient S21 with the resistance switch network 20 in the second state is contemplated to be 2.8 degrees.

FIG. 8C illustrates a third state in which both the first transistor Q1 and the second transistor Q2 are deactivated. In this condition, neither the second resistor R2 nor the third resistor R3 are shunted, with Q1 and Q2 both providing a very high resistance, e.g., greater than 1 k Ohm. The resistance that is part of the series circuit 24c of the first peripheral inductor L1, the second peripheral inductor L2, the interconnection inductor L4, and the resistance switch network 20 is the first resistor R1, the second resistor R2, and the third resistor R3. The RF signal input to the first port 11 is phase shifted by yet another prescribed angle that corresponds to the angular forward transmission coefficient (S21) of the phase shifter 10b in this third state, and output from the second port 12. The RF signal applied to the second port 12 may be shifted by the same degree and output from the first port 11 when in this third state. The resultant angular difference between the forward transmission coefficient S21 with the resistance switch network 20 in the third state may be another 2.8 degrees relative to the second state, or a total of 5.6 degrees relative to the first state. Targeting a 2.8 degrees relative phase shift may also be achieved by switching between the second state and the third state, together with the appropriate switching of the transistors Q1, Q2.

Other modalities for achieving the third state are also contemplated, as indicated above. Again, the first transistor Q1 may be activated to provide a very low resistance, while deactivating the second transistor Q2 to provide a very high resistance. The values of the second resistor R2 and the third resistor R3 may be modified accordingly, such that the value of the third resistor R3 in this variation is equivalent to the combined resistances of the second resistor R2 and the third resistor R3 in the first variation considered above.

It is also possible to configure the phase shifter 10b for a single phase shift value. Providing only a single resistor and corresponding parallel transistor in the resistance switch network 20 is understood to enable the activation and deactivation of one phase shift degree, depending on the value of the resistor that is selectively shunted. There could be one block to selectively apply a 2.8 degrees phase shift, and another block to selectively apply a 5.6 degrees phase shift. The first resistor R1 need not necessarily be a separate resistor on the semiconductor die and may constitute metallic trace losses associated with the interconnection circuitry of the phase shifter 10. The specific values of the components may vary, though it is understood that such values may depend primarily on the coupling coefficients between the different inductor L1, L2, and L3 of the triple inductor network 14. Furthermore, the component values may vary depending on the specifics of the semiconductor fabrication and technology node that is utilized. The following simulated performance results of the phase shifter 10b are based upon certain predetermined coupling coefficient values, and a change thereto is understood to require a different set of values for each of the other components of the circuit.

In the following simulation, the center inductor L2, the first peripheral inductor L1, and the second peripheral inductor L2 each have an inductance value of 150 pico Henries (pH), as well as a resistance of 3 Ohm per turn. The coupling factor of the first peripheral inductor L1 and the center inductor L2 (e.g., K1_2, as well as the coupling factor of the center inductor L2 and the second peripheral inductor L3 (e.g., K2_3) is 0.9. The coupling factor of the first peripheral inductor L1 and the second peripheral inductor L3 is set to 0.7. The interconnection inductor L4 is set to 40 pH. The capacitor C is set to 0.55 pF.

Figure 9:
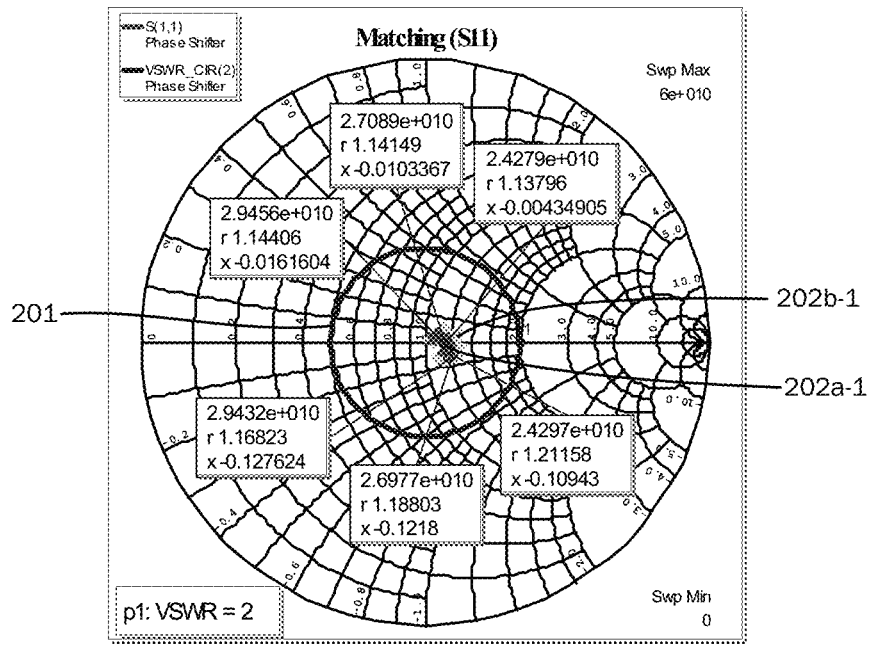
FIG. 9 is a Smith chart plotting the simulated input reflection coefficients/input return loss (S11) of the second embodiment of the bi-directional phase shifter in the first state and the second state.

The Smith chart of FIG. 9 plots the simulated input reflection coefficients/input return loss (S11) of the second embodiment of the phase shifter 10b in the first and second states. In the exemplary configuration, the least significant bit is set to apply a 2.8 degrees phase shift. The first plot 201 represents a reference voltage standing wave ratio (VSWR) of 2:1, where S11 is −10 dB. A plot 202a-1 shows the input return loss S11 of the phase shifter 10a in the first state, which can be compared to a plot 202b-1 of the input return loss S11 of the phase shifter 10b in the second state.

Figure 10A:
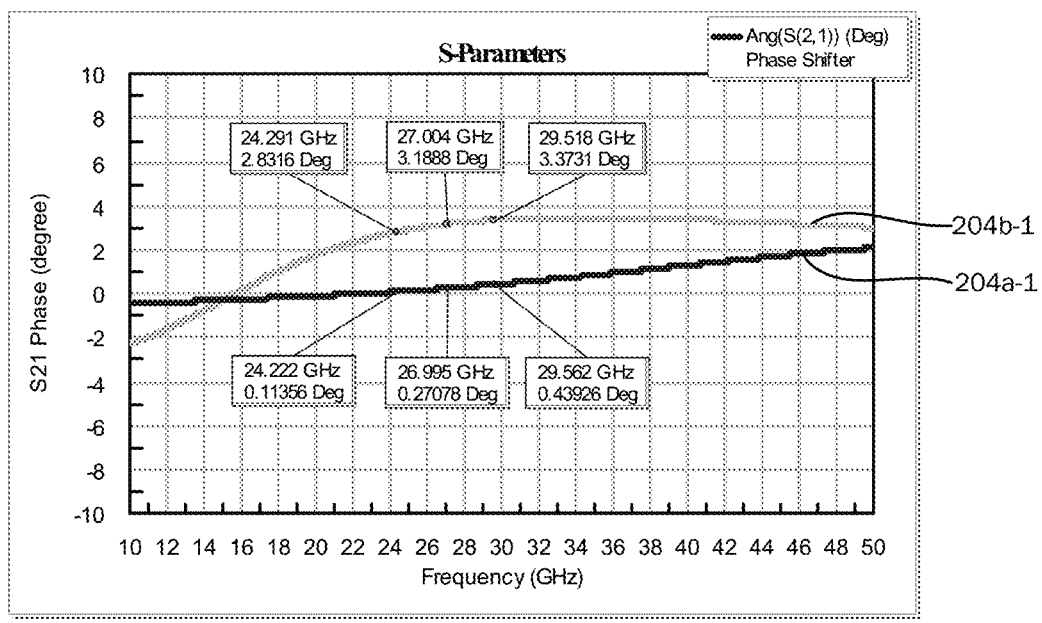
FIG. 10A is a graph plotting a sweep of simulated angular/phase components of forward transmission coefficients (S21) of the second embodiment of the bi-directional phase shifter in the first state and the second state over a frequency range.
Figure 10B:
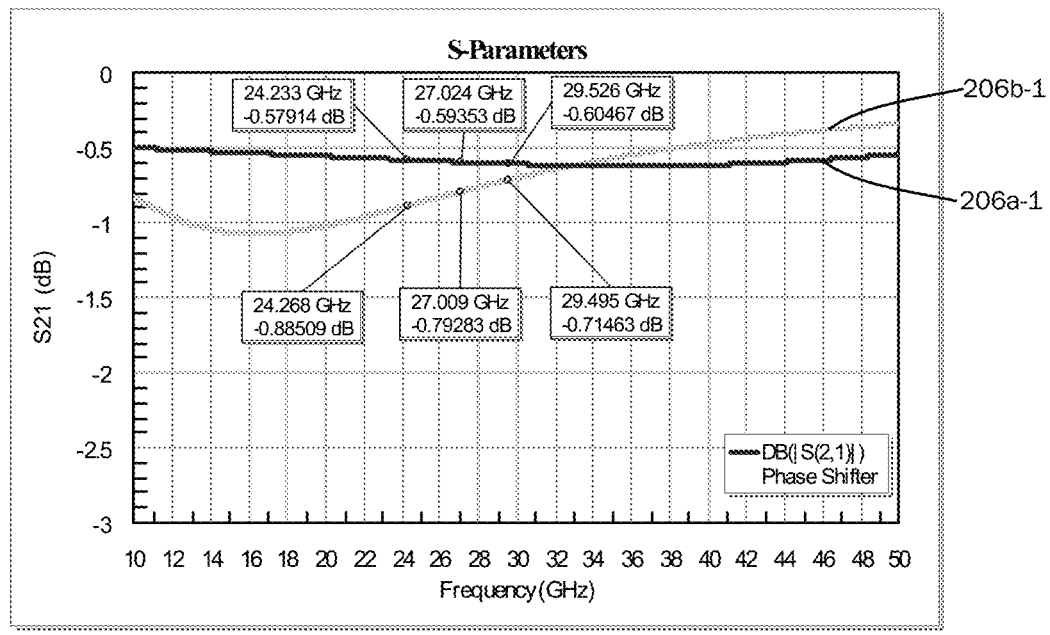
FIG. 10B is a graph plotting a sweep of simulated amplitude components of forward transmission coefficients (S21) of the second embodiment of the bi-directional phase shifter in the first state and the second state over a frequency range.
Figure 10C:
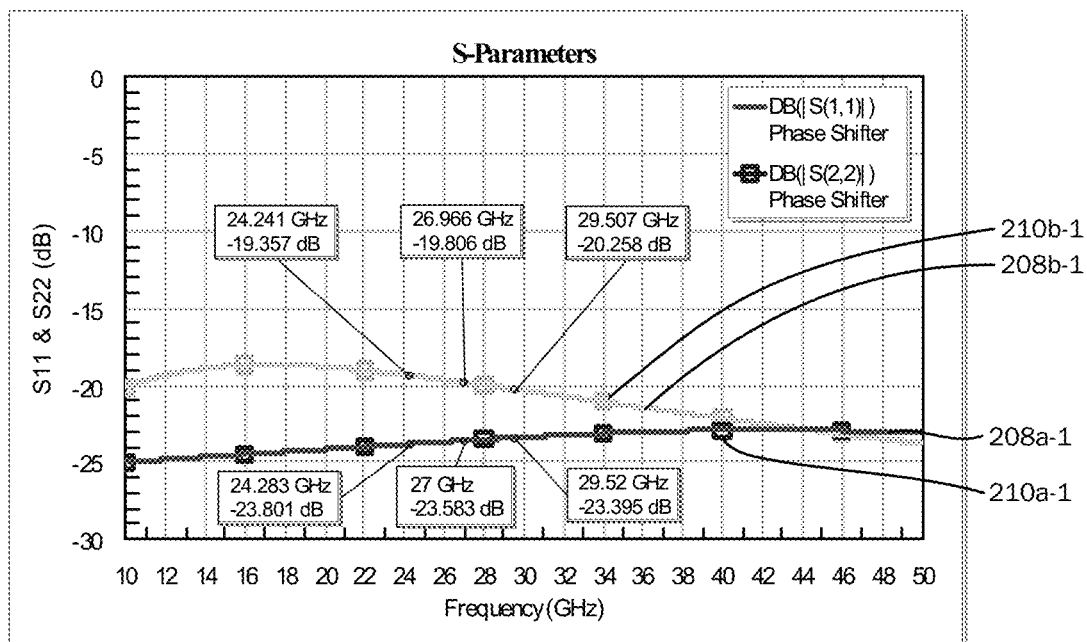
FIG. 10C is a graph plotting a sweep of simulated input/output return losses (S11, S22) of the second embodiment of the bi-directional phase shifter in the first state and the second state over a frequency range.

The graphs of FIGS. 10A, 10B, and 10C plot the simulated scattering parameters (S-parameters) of the second embodiment of the phase shifter 10b across a sweep of operating frequencies with it being in the first and second states. In particular, the graph of FIG. 10A shows a plot 204a-1 and a plot 204b-1 of the simulated angular components of the forward transmission coefficient (S21), that is, the phase shift angle (in degrees) that are applied to an RF input signal to the first port 11 and output at the second port 12. The plot 204a-1 is when the second embodiment of the phase shifter 10b is set to the first state, whereas the plot 204b-1 is when the second embodiment of the phase shifter 10b is set to the second state. Differences between the values along the plot 204a-1 and the plot 204b-1 for a given frequency range yields the relative phase shifts that are effectuated upon the RF signal from the first state to the second state, referred to as the angle delta.

The graph of FIG. 10B shows a plot 206a-1 and a plot 206b-1 of the simulated amplitude components of the forward transmission coefficient (S21), that is, the loss or attenuation of a signal applied to an RF input signal to the first port 11 and output at the second port 12. The plot 206a-1 is when the second embodiment of the phase shifter 10b is set to the first state, and the plot 206b-1 is when the second embodiment of the phase shifter 10b is set to the second state. Differences between the values along the plot 206a-1 and the plot 206b-1 for a given frequency range yields the relative loss or attenuation of the RF signal from the first state to the second state, referred to as the loss delta.

The graph of FIG. 10C shows a plot 208a-1 and a plot 208b-1 of the simulated first port reflection coefficient (S11) or input return loss when the second embodiment of the phase shifter 10b is in the first state and the second state, respectively. There is additionally a plot 210a-1 and a plot 210b-1 of the simulated second port reflection coefficient (S22) or input return loss when the second embodiment of the phase shifter 10b is in the first state and the second state, respectively. The plots 208 are for the input RF signal being applied to the first port 11, whereas the plots 210 are for the input RF signal being applied to the second port 12.

The following table 5 summarizes the simulated performance of the second embodiment of the phase shifter 10b when in the first state and the second state, corresponding to the target phase shift of 2.8 degrees. The simulated values are organized according to the discrete 5G mmWave operating frequencies of 24.24 GHz, 27.0 GHz, and 29.5 GHz, with the actual computed values being those that of frequencies closest thereto. The values of the first resistor R1, the second resistor R2, and the third resistor R3 utilized for this simulation are also provided.

TABLE 5

|  | 24.25 GHz | 27.0 GHz | 29.5 GHz |
| --- | --- | --- | --- |
| Target shift (degrees) |  | 2.8 |  |
| Angle delta, (degrees) | 2.72 | 2.92 | 2.93 |
| Loss delta (dB) | 0.31 | 0.2 | 0.11 |
| Max S11 (dB) | −19.36 | −19.81 | −20.26 |
| Max loss (dB) | −1.04 | −1.08 | −1.12 |
| R1 (Ohm) |  | 5 |  |
| R2 (Ohm) |  | 34 |  |
| R3 (Ohm) |  | 0 |  |

It is envisioned that there be only a small variation in phase shift from the 2.8 degrees target, and more specifically, specifically less than +0.13 degrees or −0.08 degrees of variation. Furthermore, there is understood to be less than 0.31 dB variation with respect to the forward transmission coefficient/signal attenuation S21 across the full frequency band. According to the simulation, there is a low maximum insertion loss of less than 1.12 dB across the full frequency band. Furthermore, the worst-case input return loss (S11) appears to be less than −19 dB across the full frequency band.

Figure 11:
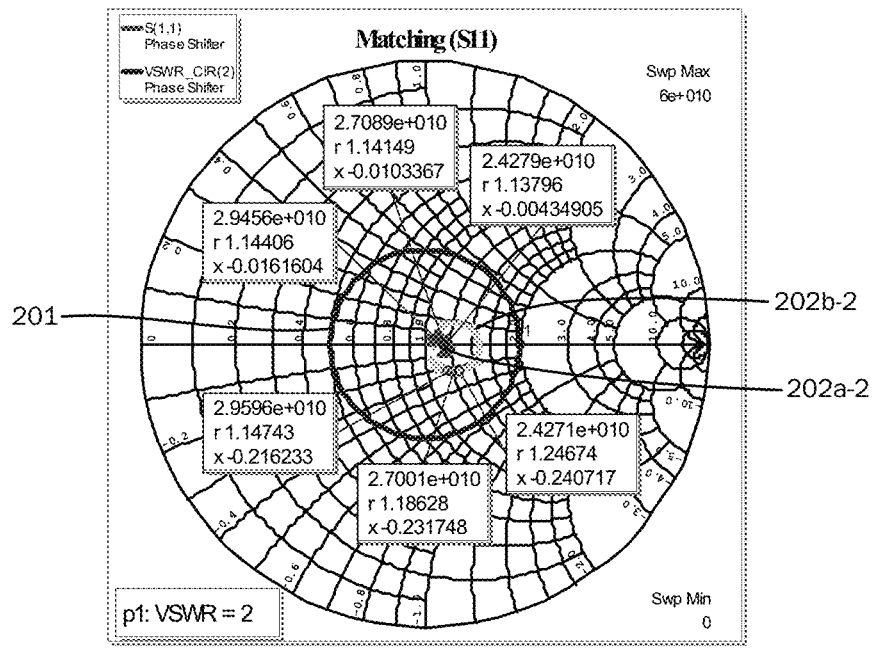
FIG. 11 is a Smith chart plotting the simulated input reflection coefficients/input return loss (S11) of the second embodiment of the bi-directional phase shifter in the first state and the third state.

The Smith chart of FIG. 11 plots the simulated input reflection coefficients/input return loss (S11) of the second embodiment of the phase shifter 10b in the first and third states. In the exemplary configuration, the least significant bit is set to apply a 5.6 degrees phase shift. The first plot 201 represents a reference voltage standing wave ratio (VSWR) of 2:1, where S11 is −10 dB. A plot 202a-2 shows the input return loss S11 of the phase shifter 10b in the first state, which can be compared to a plot 202b-2 of the input return loss S11 of the phase shifter 10b in the third state.

Figure 12A:
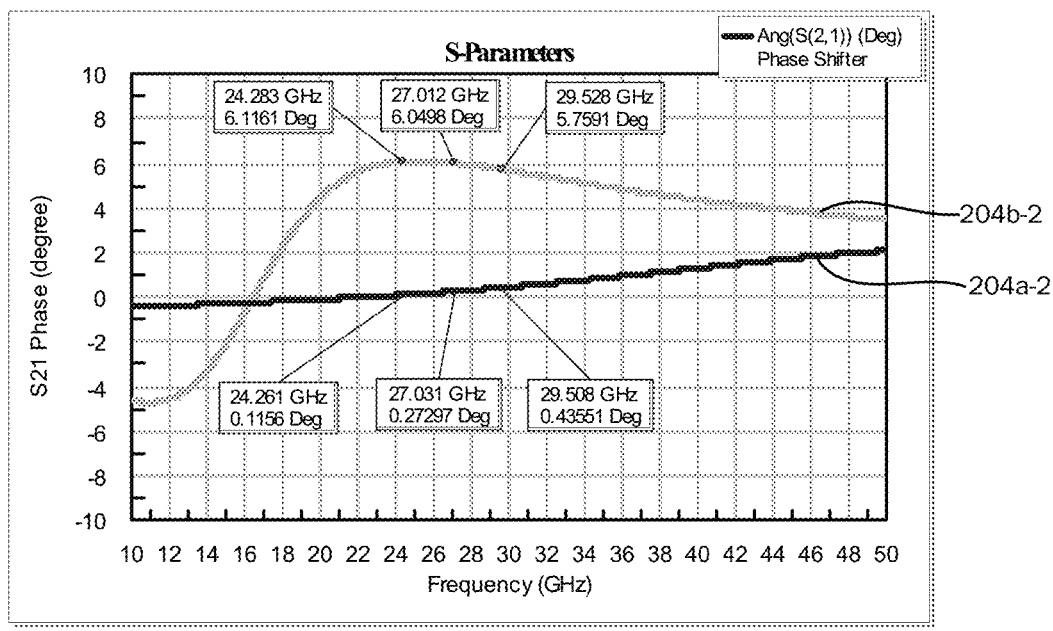
FIG. 12A is a graph plotting a sweep of simulated angular/phase components of forward transmission coefficients (S21) of the second embodiment of the bi-directional phase shifter in the first state and the third state over a frequency range.
Figure 12B:
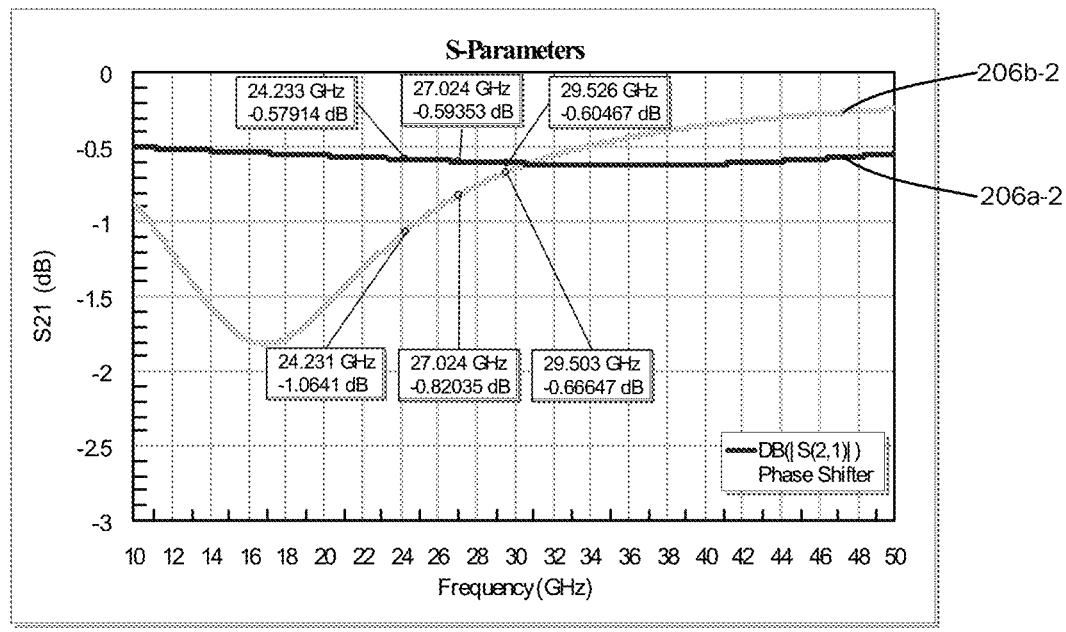
FIG. 12B is a graph plotting a sweep of simulated amplitude components of forward transmission coefficients (S21) of the second embodiment of the bi-directional phase shifter in the first state and the third state over a frequency range.
Figure 12C:
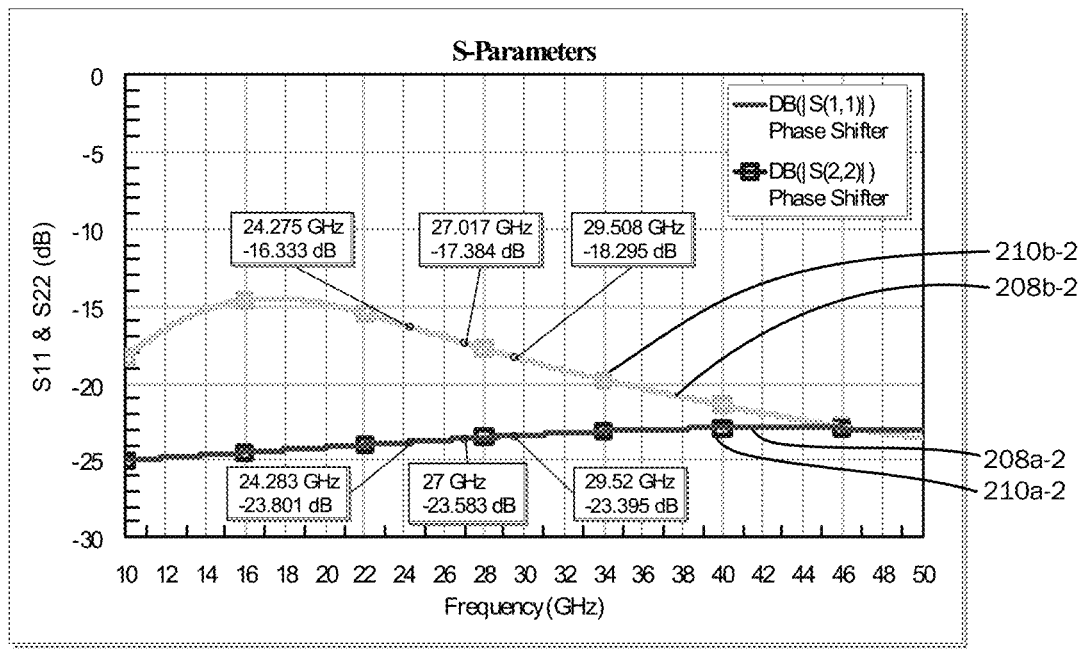
FIG. 12C is a graph plotting a sweep of simulated input/output return losses (S11, S22) of the second embodiment of the bi-directional phase shifter in the first state and the third state over a frequency range.

The graphs of FIGS. 12A, 12B, and 12C plot the simulated scattering parameters (S-parameters) of the second embodiment of the phase shifter 10b across a sweep of operating frequencies with it being in the first and third states. The graph of FIG. 12A shows a plot 204a-2 and a plot 204b-2 of the simulated angular components of the forward transmission coefficient (S21), that is, the phase shift angle (in degrees) that are applied to an RF input signal to the first port 11 and output at the second port 12. The plot 204a-2 is when the second embodiment of the phase shifter 10b is set to the first state, and the plot 204b-2 is when the second embodiment of the phase shifter 10b is set to the third state. Differences between the values along the plot 204a-2 and the plot 204b-2 for a given frequency range yields the relative phase shifts that are effectuated upon the RF signal from the first state to the third state, referred to as the angle delta.

The graph of FIG. 12B shows a plot 206a-2 and a plot 206b-2 of the simulated amplitude components of the forward transmission coefficient (S21), that is, the loss or attenuation of a signal applied to an RF input signal to the first port 11 and output at the second port 12. The plot 206a-2 is when the second embodiment of the phase shifter 10b is set to the first state, and the plot 206b-2 is when the second embodiment of the phase shifter 10b is set to the third state. Differences between the values along the plot 206a-2 and the plot 206b-2 for a given frequency range yields the relative loss or attenuation of the RF signal from the first state to the third state, referred to as the loss delta.

The graph of FIG. 12C shows a plot 208a-2 and a plot 208b-2 of the simulated first port reflection coefficient (S11) or input return loss when the second embodiment of the phase shifter 10b is in the first state and the third state, respectively. There is additionally a plot 210a-2 and a plot 210b-2 of the simulated second port reflection coefficient (S22) or input return loss when the second embodiment of the phase shifter 10b is in the first state and the third state, respectively. The plots 208 are for the input RF signal being applied to the first port 11, whereas the plots 210 are for the input RF signal being applied to the second port 12.

The following table 6 summarizes the simulated performance of the second embodiment of the phase shifter 10b when in the first state and the third state, corresponding to the target phase shift of 5.6 degrees. The simulated values are organized according to the discrete 5G mmWave operating frequencies of 24.24 GHz, 27.0 GHz, and 29.5 GHz, with the actual computed values being those that of frequencies closest thereto. The values of the first resistor R1, the second resistor R2, and the third resistor R3 utilized for this simulation are also provided.

TABLE 6

|  | 24.25 GHz | 27.0 GHz | 29.5 GHz |
| --- | --- | --- | --- |
| Target shift (degrees) |  | 5.6 |  |
| Angle delta, (degrees) | 6.0 | 5.78 | 5.32 |
| Loss delta (dB) | 0.48 | 0.23 | 0.06 |
| Max S11 (dB) | −16.33 | −17.38 | −18.3 |
| Max loss (dB) | −1.04 | −1.08 | −1.12 |
| R1 (Ohm) |  | 5 |  |
| R2 (Ohm) |  | 34 |  |
| R3 (Ohm) |  | 56 |  |

Only a small variation in phase shift from the 5.6 degrees target, and more specifically, specifically less than +0.4 degrees or −0.28 degrees of variation. There is understood to be less than 0.48 dB variation with respect to the forward transmission coefficient/signal attenuation S21 across the full frequency band. According to the simulation, there is a low maximum insertion loss of less than 1.12 dB across the full frequency band. Furthermore, the worst-case input return loss (S11) appears to be less than −16 dB across the full frequency band.

The following table 7 summarizes the simulated performance of the second embodiment of the phase shifter 10b, with the aforementioned alternative configuration in which there is only a single transistor/resistor for the 5.6 degrees phase shift step.

TABLE 7

|  | 24.25 GHz | 27.0 GHz | 29.5 GHz |
| --- | --- | --- | --- |
| Target shift (degrees) |  | 5.6 |  |
| Angle delta, (degrees) | 6.0 | 5.78 | 5.32 |
| Loss delta (dB) | 0.48 | 0.23 | 0.06 |
| Max S11 (dB) | −16.33 | −17.38 | −18.3 |
| Max loss (dB) | −1.04 | −1.08 | −1.12 |
| R1 (Ohm) |  | 5 |  |
| R2 (Ohm) |  | 0 |  |
| R3 (Ohm) |  | 90 |  |

The following table 8 summarizes the simulated performance of the second embodiment of the phase shifter 10b when it is operated to effectuate a 2.8 degrees phase shift from the second state to the third state. In this operation, it is contemplated to exhibit a low loss delta of less than 0.18 dB across the entire frequency band for the 2.8 degrees phase shifter segment, while also maintain a low phase shift delta of less than 0.48 degrees across the full frequency band.

TABLE 8

|  | 24.25 GHz | 27.0 GHz | 29.5 GHz |
| --- | --- | --- | --- |
| Target shift (degrees) |  | 2.8 |  |
| Angle delta, (degrees) | 3.28 | 2.86 | 2.39 |
| Loss delta (dB) | 0.18 | 0.03 | 0.05 |
| Max S11 (dB) | −16.33 | −17.38 | −18.3 |
| Max loss (dB) | −1.04 | −1.08 | −1.12 |
| R1 (Ohm) |  | 5 |  |
| R2 (Ohm) |  | 34 |  |
| R3 (Ohm) |  | 56 |  |

Figure 13:
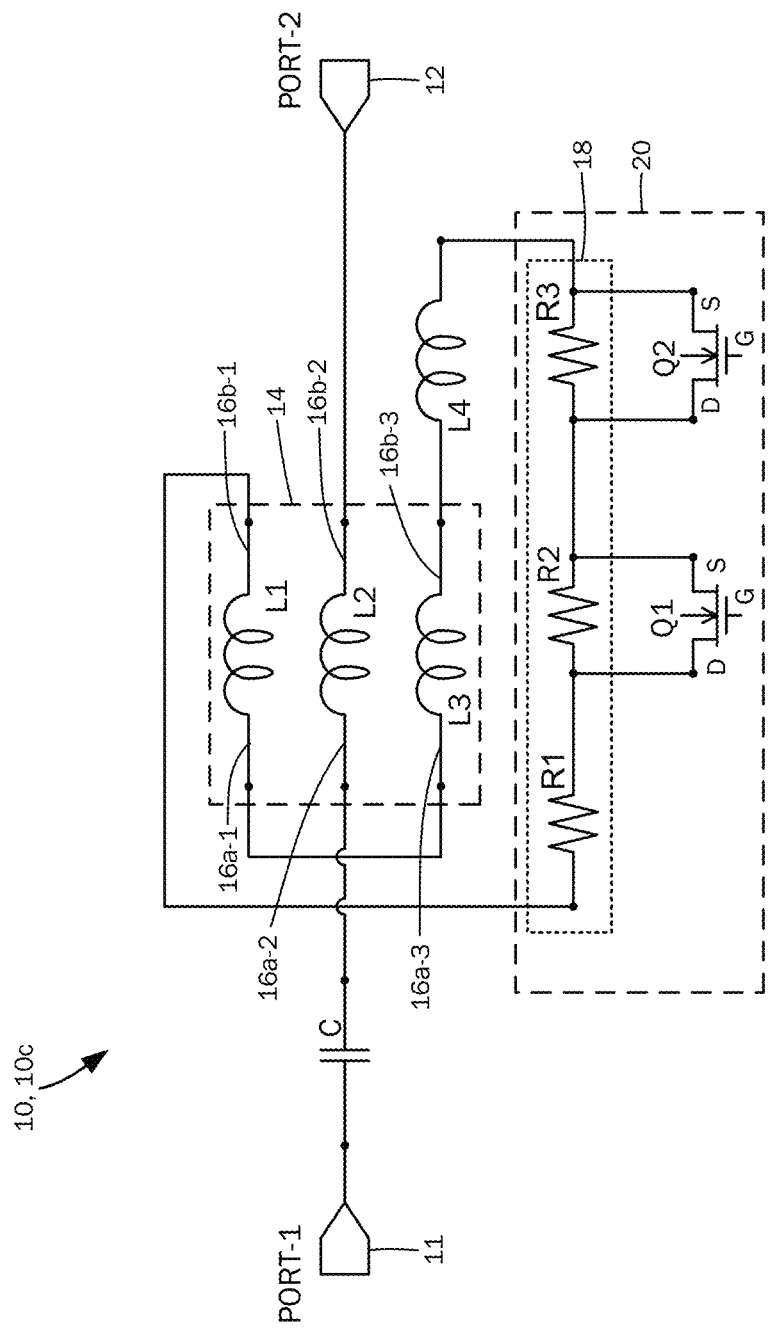
FIG. 13 is a schematic diagram of a third embodiment of a bi-directional phase shifter in accordance with the present disclosure.

The schematic diagram of FIG. 13 illustrates a third embodiment of the bidirectional phase shifter 10c that likewise incorporates the first port 11 and the second port 12, either of which may serve as an RF signal input or an output, and vice versa. The third embodiment of the phase shifter 10c, as with the first embodiment 10a and the second embodiment 10b considered above, is a passive two-step phase shifter that may be controlled with the two least significant bits (LSBs) of a digital or stepped control. Thus, the phase shifter 10c is contemplated to be used to apply 2.8 degrees and 5.6 degrees of phase shift to signals in mmWave frequencies. The second embodiment 10c, however, incorporates an additional capacitor connected to the first port 11, as will be described more fully below.

The phase shifter 10c includes the same triple inductor network 14 comprised of the center inductor L2, the first peripheral inductor L1, and the second peripheral inductor L3. The center inductor L2 is defined by the first terminal 16a-2 that is electrically connected to the first port 11, and the second terminal 16b-2 that is electrically connected to the second port 12. The first peripheral inductor L11 has the first terminal 16a-1 and the second terminal 16b-1, while the second peripheral inductor L2 has the first terminal 16a-3 and the second terminal 16b-3. The first peripheral inductor L1 is electromagnetically coupled to the center inductor L2, and the second peripheral inductor L3 is electromagnetically coupled to the center inductor L2. The Inductors L1 and L3 are also electromagnetically coupled to each other due to final distance between these inductors but coupling coefficient is typically smaller compared with coupling between either L1 and L2 or L3 and L2.

The third embodiment of the phase shifter 10c includes the same resistor network 18 comprised of the first resistor R1, the second resistor R2 connected in series with the first resistor R1, and the third resistor R3 connected in series with the second resistor R2. The resistor network 18 is connected in series with the triple inductor network 14, with the first peripheral inductor L1 and the second terminal 16b-1 thereof being connected to the first resistor R1, and the second peripheral inductor L3 and the second terminal 16b-3 thereof being connected to the third resistor R3. The interconnection inductor L4 is interposed between the third resistor R3 and the second terminal 16b-3 of the second peripheral inductor L3.

The phase shifter 10c further incorporates the first transistor Q1 that is connected in parallel to the second resistor R2, as well as the second transistor Q2 that is connected in parallel to the third resistor R3. In an exemplary embodiment, the drain terminal of the first transistor Q1 is connected to the first one of the terminals of the second resistor R2, and the source terminal of the first transistor Q1 is connected to the other one of the terminals of the second resistor R2. The drain terminal of the second transistor Q2 is electrically contiguous/connected to the source terminal of the first transistor Q1, along with the second one of the terminals of the second resistor R2 and the first one of the terminals of the third resistor R3. The source terminal of the second transistor Q2 is connected to the second one of the terminals of the third resistor R3. The interconnection inductor L4 is connected to the second terminal 16b-3 of the second peripheral inductor L3, along with the source terminal of the second transistor Q2 and the second one of the terminals of the third resistor R3. The triple inductor network 14 also defines a series connection of the first peripheral inductor L1 and the second peripheral inductor L3. The first terminal 16a-1 of the first peripheral inductor L1 is therefore connected to the first terminal 16a-3 of the second peripheral inductor L3.

The third embodiment of the phase shifter 10c additionally incorporates a capacitor C that is connected to the center inductor L2 and the first port 11. That is, the capacitor C is connected in series with the center inductor L2, with a first one of the terminals of the capacitor C being connected to the first port 11, and the other one of the terminals being connected to the first terminal 16a-2 of the center inductor L2.

The triple inductor network 14 and the particular electromagnetic coupling between the peripheral inductors and the center inductor L2 is contemplated to effectuate different phase shifts to a signal traversing the center inductor L2. The selective connection of the resistors R1, R2, and R3 of the resistor network 18 is controlled by the transistors Q1 and Q2. The resistance switch network 20, which includes the resistors R1, R2, and R3, as well as the first transistor Q1 and the second transistor Q2, is connected to the triple inductor network 14, such that different states are selectively activatable.

Figure 14A:
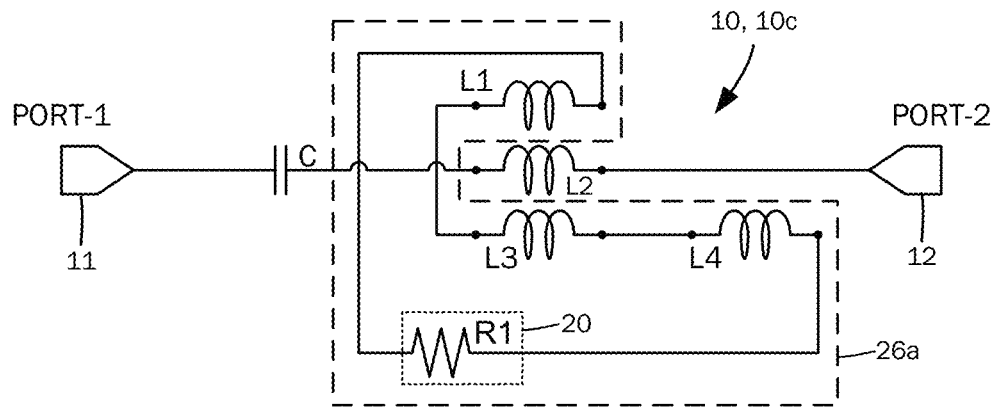
FIG. 14A is a schematic diagram of an equivalent circuit of the third embodiment of the bi-directional phase shifter shown in FIG. 13, in a first state.
Figure 14B:
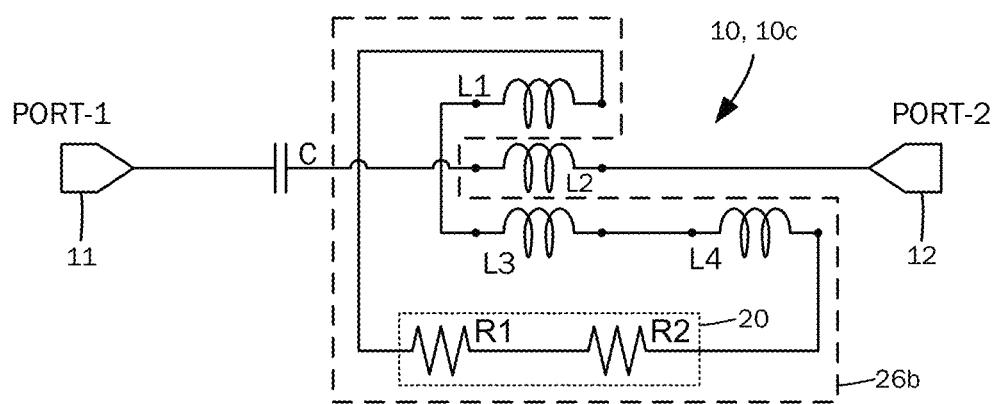
FIG. 14B is a schematic diagram of an equivalent circuit of the third embodiment of the bi-directional phase shifter in a second state.
Figure 14C:
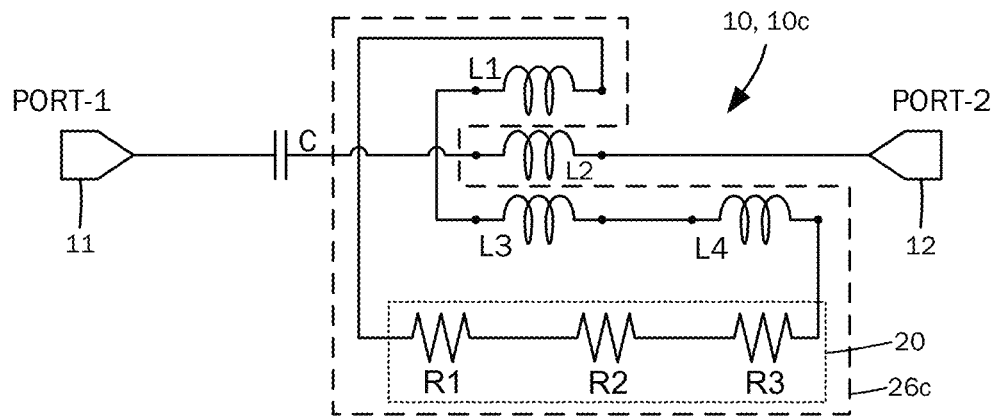
FIG. 14C is a schematic diagram of an equivalent circuit of the third embodiment of the bi-directional phase shifter in a third state.

FIGS. 14A-14C illustrate three such possible states with the transistors Q1 and Q2 being in various activated and deactivated conditions. FIG. 14A illustrates the first state in which the first transistor Q1 and the second transistor Q2 are both activated. In this condition, the resistors R2 and R3 are both shunted by the respective transistors Q1 and Q2 connected in parallel thereto, with the transistors providing a low resistance, e.g., less than 5 Ohm. The resistance that is part of the series circuit 26a of the first peripheral inductor L1, the second peripheral inductor L3, the interconnection inductor L4, and the resistance switch network 20 is thus the first resistor R1. The RF signal input to the first port 11 is phase-shifted by a prescribed angle that corresponds to the angular forward transmission coefficient (S21) of the phase shifter 10c in this first state, and output from the second port 12. Because the phase shifter 10c is bi-directional, the same RF signal applied to the second port 12 is understood to be shifted by the same degree and output from the first port 11.

FIG. 14B illustrates the second state in which the first transistor Q1 is deactivated and the second transistor Q1 is activated. In this condition, the third resistor R3 is shunted by the transistor Q2, but the second resistor R2 is not. The activated second transistor Q2 again contributes a low resistance, e.g., less than 5 Ohm, while the deactivated second transistor Q1 contributes a very high resistance, e.g., greater than 1 k Ohm. The resistance that is part of the series circuit 26b of the first peripheral inductor L1, the second peripheral inductor L3, the interconnection inductor L4, and the resistance switch network 20 is the first resistor R1 as in the first state, as well as the second resistor R2. The RF signal input to the first port 11 is phase shifted by another prescribed angle that corresponding to the angular forward transmission coefficient (S21) of the phase shifter 10c in this second state, and output from the second port 12. Again, with the phase shifter 10 being bi-directional, the RF signal applied to the second port 12 may be shifted by the same degree and output from the first port 11 when otherwise in this second state. The resultant angular difference between the forward transmission coefficient S21 with the resistance switch network 20 in the first state and the forward transmission coefficient S21 with the resistance switch network 20 in the second state is contemplated to be 2.8 degrees.

FIG. 14C illustrates a third state in which both the first transistor Q1 and the second transistor Q2 are deactivated. In this condition, neither the second resistor R2 nor the third resistor R3 are shunted, with Q1 and Q2 both providing a very high resistance, e.g., greater than 1 k Ohm. The resistance that is part of the series circuit 26c of the first peripheral inductor L1, the second peripheral inductor L2, the interconnection inductor L4, and the resistance switch network 20 is the first resistor R1, the second resistor R2, and the third resistor R3. The RF signal input to the first port 11 is phase shifted by yet another prescribed angle that corresponds to the angular forward transmission coefficient (S21) of the phase shifter 10c in this third state, and output from the second port 12. The RF signal applied to the second port 12 may be shifted by the same degree and output from the first port 11 when in this third state. The resultant angular difference between the forward transmission coefficient S21 with the resistance switch network 20 in the third state may be another 2.8 degrees relative to the second state, or a total of 5.6 degrees relative to the first state. Targeting a 2.8 degrees relative phase shift may also be achieved by switching between the second state and the third state, together with the appropriate switching of the transistors Q1, Q2.

Other modalities for achieving the third state are also contemplated, as indicated above. Again, the first transistor Q1 may be activated to provide a very low resistance, while deactivating the second transistor Q2 to provide a very high resistance. The values of the second resistor R2 and the third resistor R3 may be modified accordingly, such that the value of the third resistor R3 in this variation is equivalent to the combined resistances of the second resistor R2 and the third resistor R3 in the first variation considered above.

It is also possible to configure the phase shifter 10c for a single phase shift value. Providing only a single resistor and corresponding parallel transistor in the resistance switch network 20 is understood to enable the activation and deactivation of one phase shift degree, depending on the value of the resistor that is selectively shunted. There could be one block to selectively apply a 2.8 degrees phase shift, and another block to selectively apply a 5.6 degrees phase shift. The first resistor R1 need not necessarily be a separate resistor on the semiconductor die and may constitute metallic trace losses associated with the interconnection circuitry of the phase shifter 10. The specific values of the components may vary, though it is understood that such values may depend primarily on the coupling coefficients between the different inductor L1, L2, and L3 of the triple inductor network 14. Furthermore, the component values may vary depending on the specifics of the semiconductor fabrication and technology node that is utilized. The following simulated performance results of the phase shifter 10b are based upon certain predetermined coupling coefficient values, and a change thereto is understood to require a different set of values for each of the other components of the circuit.

In the following simulation, the center inductor L2, the first peripheral inductor L1, and the second peripheral inductor L2 each have an inductance value of 150 pH, as well as a resistance of 3 Ohm per turn. The coupling factor of the first peripheral inductor L1 and the center inductor L2 (e.g., K1_2, as well as the coupling factor of the center inductor L2 and the second peripheral inductor L3 (e.g., K2_3) is 0.9. The coupling factor of the first peripheral inductor L1 and the second peripheral inductor L3 is set to 0.7. The interconnection inductor L4 is set to 40 pH. The capacitor C is set to be 0.24 pF.

Figure 15:
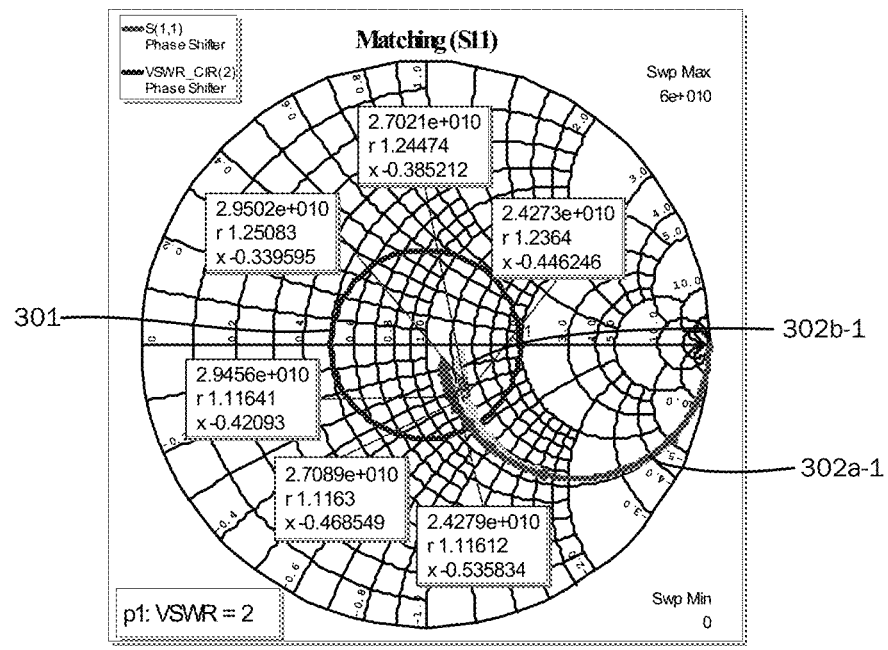
FIG. 15 is a Smith chart plotting the simulated input reflection coefficients/input return loss (S11) of the third embodiment of the bi-directional phase shifter in the first state and the second state.

The Smith chart of FIG. 15 plots the simulated input reflection coefficients/input return loss (S11) of the third embodiment of the phase shifter 10c in the first and second states. In the exemplary configuration, the least significant bit is set to apply a 2.8 degrees phase shift. The first plot 301 represents a reference voltage standing wave ratio (VSWR) of 2:1, where S11 is −10 dB. A plot 302a-1 shows the input return loss S11 of the phase shifter 10a in the first state, which can be compared to a plot 302b-1 of the input return loss S11 of the phase shifter 10c in the second state.

Figure 16A:
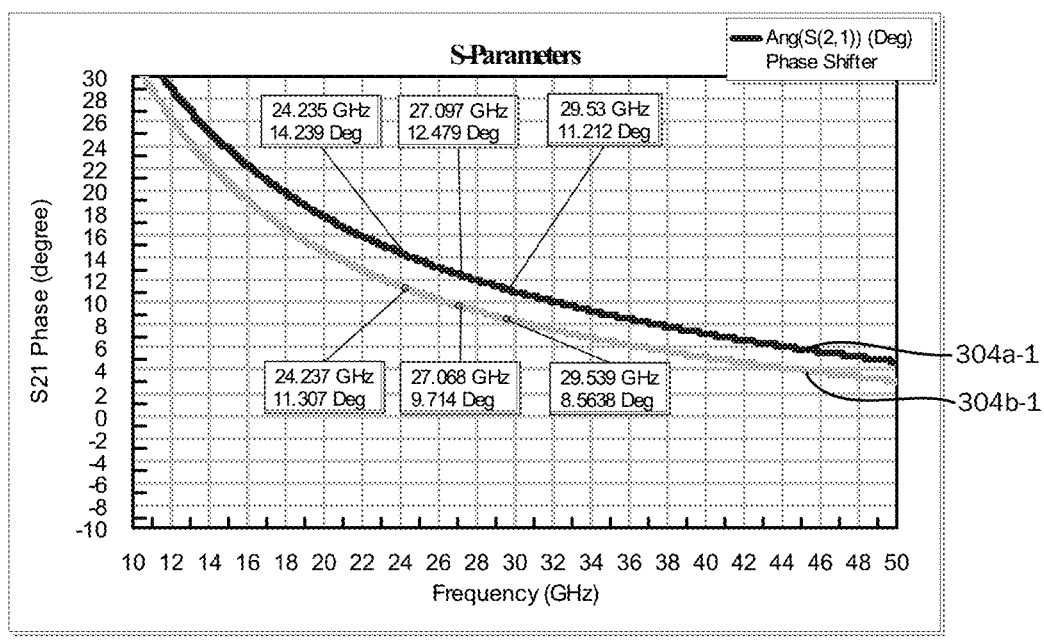
FIG. 16A is a graph plotting a sweep of simulated angular/phase components of forward transmission coefficients (S21) of the third embodiment of the bi-directional phase shifter in the first state and the second state over a frequency range.
Figure 16B:
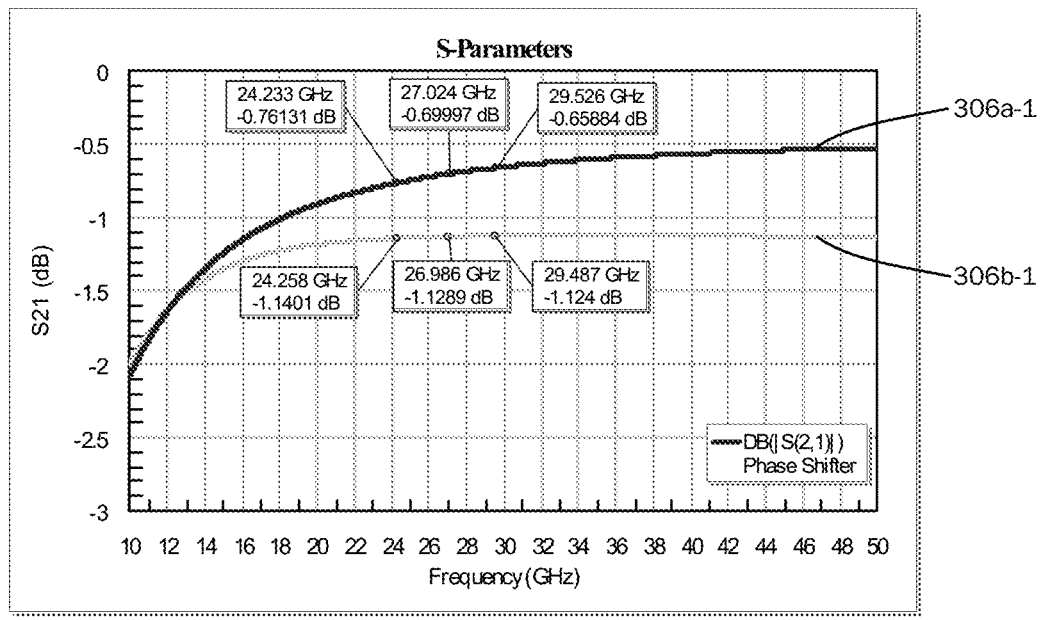
FIG. 16B is a graph plotting a sweep of simulated amplitude components of forward transmission coefficients (S21) of the third embodiment of the bi-directional phase shifter in the first state and the second state over a frequency range.
Figure 16C:
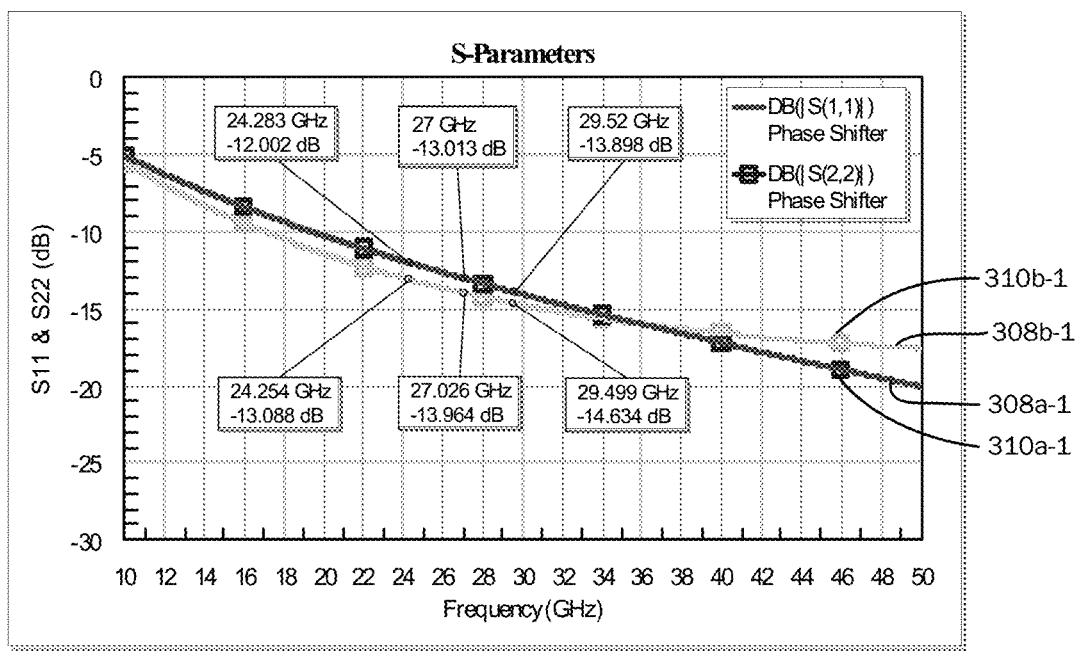
FIG. 16C is a graph plotting a sweep of simulated input/output return losses (S11, S22) of the third embodiment of the bi-directional phase shifter in the first state and the second state over a frequency range.

The graphs of FIGS. 16A, 16B, and 16C plot the simulated scattering parameters (S-parameters) of the third embodiment of the phase shifter 10c across a sweep of operating frequencies with it being in the first and second states. In particular, the graph of FIG. 16A shows a plot 304a-1 and a plot 304b-1 of the simulated angular components of the forward transmission coefficient (S21), that is, the phase shift angle (in degrees) that are applied to an RF input signal to the first port 11 and output at the second port 12. The plot 304a-1 is when the third embodiment of the phase shifter 10c is set to the first state, whereas the plot 304b-1 is when the third embodiment of the phase shifter 10c is set to the second state. Differences between the values along the plot 304a-1 and the plot 304b-1 for a given frequency range yields the relative phase shifts that are effectuated upon the RF signal from the first state to the second state, referred to as the angle delta.

The graph of FIG. 16B shows a plot 306a-1 and a plot 306b-1 of the simulated amplitude components of the forward transmission coefficient (S21), that is, the loss or attenuation of a signal applied to an RF input signal to the first port 11 and output at the second port 12. The plot 306a-1 is when the third embodiment of the phase shifter 10c is set to the first state, and the plot 306b-1 is when the third embodiment of the phase shifter 10c is set to the second state. Differences between the values along the plot 306a-1 and the plot 306b-1 for a given frequency range yields the relative loss or attenuation of the RF signal from the first state to the second state, referred to as the loss delta.

The graph of FIG. 16C shows a plot 308a-1 and a plot 308b-1 of the simulated first port reflection coefficient (S11) or input return loss when the third embodiment of the phase shifter 10c is in the first state and the second state, respectively. There is additionally a plot 310a-1 and a plot 310b-1 of the simulated second port reflection coefficient (S22) or input return loss when the third embodiment of the phase shifter 10c is in the first state and the second state, respectively. The plots 308 are for the input RF signal being applied to the first port 11, whereas the plots 310 are for the input RF signal being applied to the second port 12.

The following table 9 summarizes the simulated performance of the third embodiment of the phase shifter 10c when in the first state and the second state, corresponding to the target phase shift of 2.8 degrees. The simulated values are organized according to the discrete 5G mmWave operating frequencies of 24.24 GHz, 27.0 GHz, and 29.5 GHz, with the actual computed values being those that of frequencies closest thereto. The values of the first resistor R1, the second resistor R2, and the third resistor R3 utilized for this simulation are also provided.

TABLE 9

|  | 24.25 GHz | 27.0 GHz | 29.5 GHz |
| --- | --- | --- | --- |
| Target shift (degrees) |  | 2.8 |  |
| Angle delta, (degrees) | 2.93 | 2.77 | 2.65 |
| Loss delta (dB) | 0.38 | 0.43 | 0.47 |
| Max S11 (dB) | −12.0 | −13.01 | −13.9 |
| Max loss (dB) | −1.18 | −1.23 | −1.28 |
| R1 (Ohm) |  | 5 |  |
| R2 (Ohm) |  | 41 |  |
| R3 (Ohm) |  | 0 |  |

It is envisioned that there be only a small variation in phase shift from the 2.8 degrees target, and more specifically, specifically less than +0.13 degrees or −0.15 degrees of variation. Furthermore, there is understood to be less than 0.47 dB variation with respect to the forward transmission coefficient/signal attenuation S21 across the full frequency band. According to the simulation, there is a low maximum insertion loss of less than 1.28 dB across the full frequency band. Furthermore, the worst-case input return loss (S11) appears to be less than −12 dB across the full frequency band.

Figure 17:
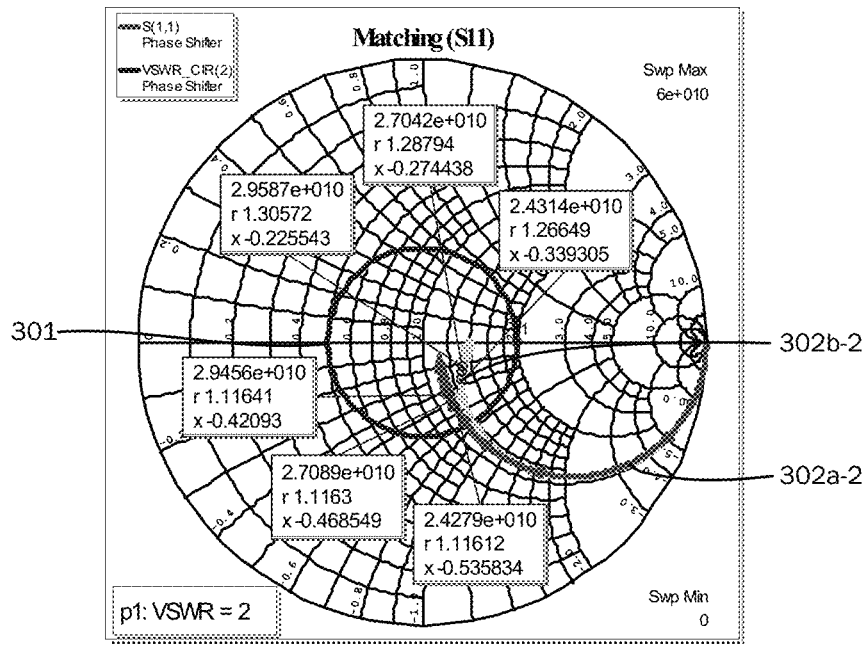
FIG. 17 is a Smith chart plotting the simulated input reflection coefficients/input return loss (S11) of the third embodiment of the bi-directional phase shifter in the first state and the third state.

The Smith chart of FIG. 17 plots the simulated input reflection coefficients/input return loss (S11) of the third embodiment of the phase shifter 10c in the first and third states. In the exemplary configuration, the least significant bit is set to apply a 5.6 degrees phase shift. The first plot 301 represents a reference voltage standing wave ratio (VSWR)

of 2:1, where S11 is −10 dB. A plot 302a-2 shows the input return loss S11 of the phase shifter 10c in the first state, which can be compared to a plot 302b-2 of the input return loss S11 of the phase shifter 10c in the third state.

Figure 18A:
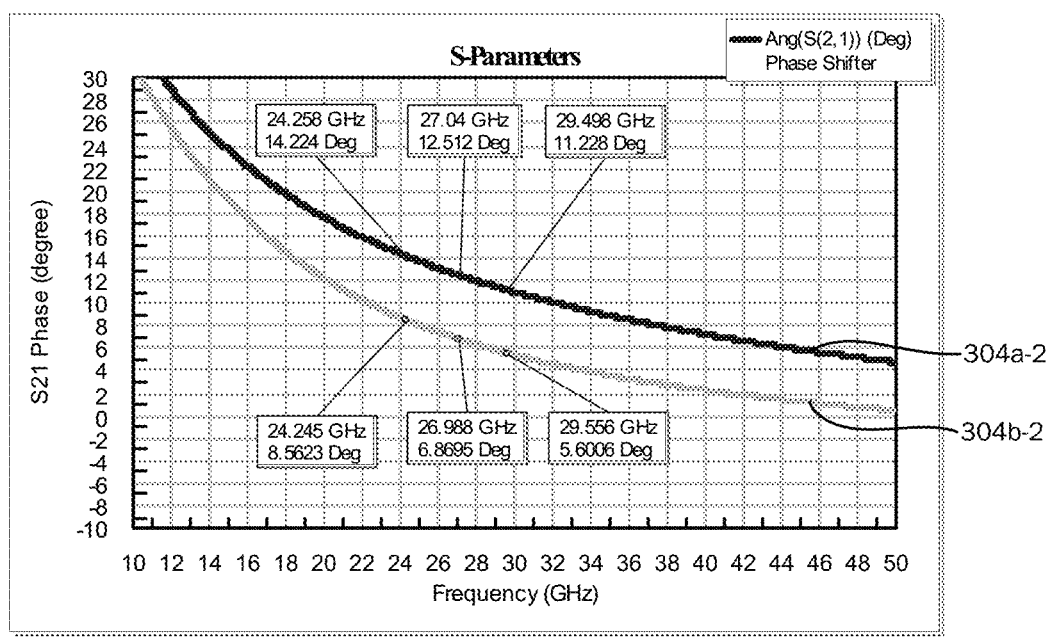
FIG. 18A is a graph plotting a sweep of simulated angular/phase components of forward transmission coefficients (S21) of the third embodiment of the bi-directional phase shifter in the first state and the third state over a frequency range.
Figure 18B:
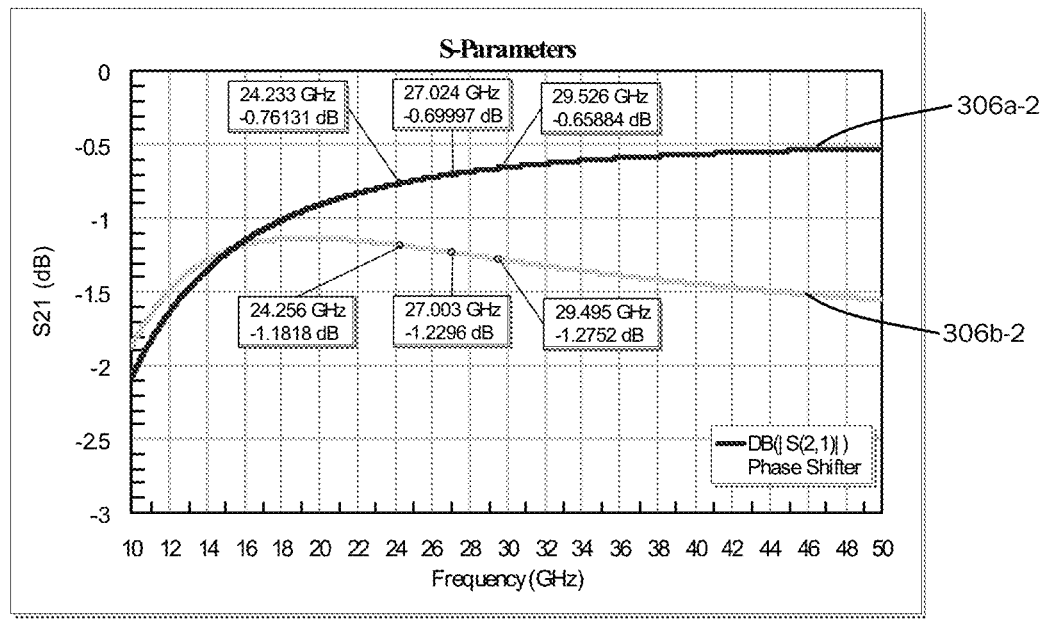
FIG. 18B is a graph plotting a sweep of simulated amplitude components of forward transmission coefficients (S21) of the third embodiment of the bi-directional phase shifter in the first state and the third state over a frequency range.
Figure 18C:
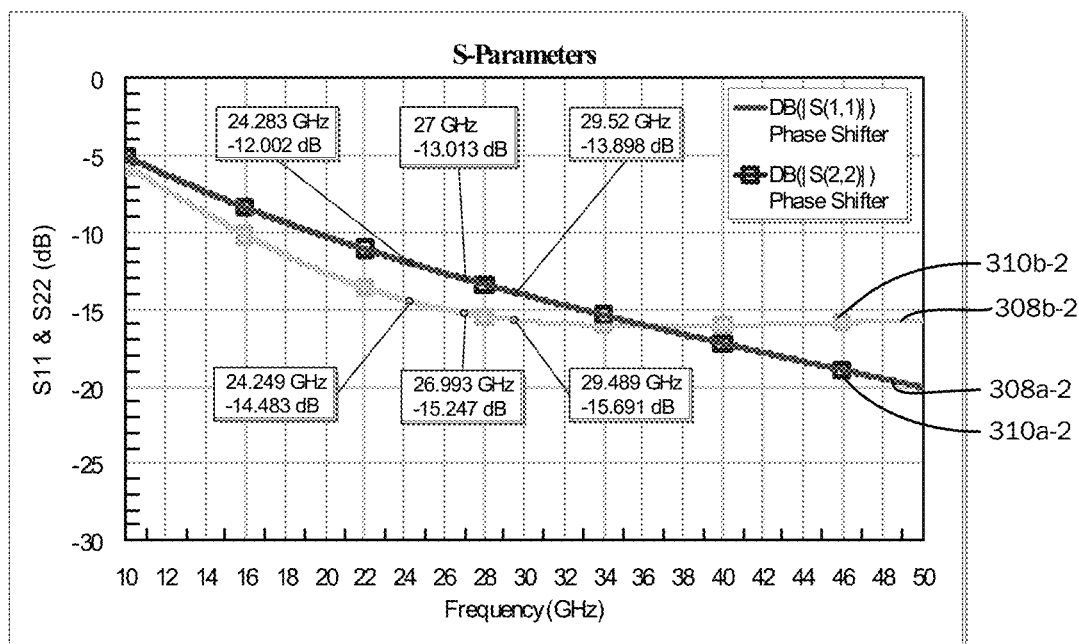
FIG. 18C is a graph plotting a sweep of simulated input/output return losses (S11, S22) of the third embodiment of the bi-directional phase shifter in the first state and the third state over a frequency range.

The graphs of FIGS. 18A, 18B, and 18C plot the simulated scattering parameters (S-parameters) of the third embodiment of the phase shifter 10c across a sweep of operating frequencies with it being in the first and third states. The graph of FIG. 18A shows a plot 304a-2 and a plot 304b-2 of the simulated angular components of the forward transmission coefficient (S21), that is, the phase shift angle (in degrees) that are applied to an RF input signal to the first port 11 and output at the second port 12. The plot 304a-2 is when the third embodiment of the phase shifter 10c is set to the first state, and the plot 304b-2 is when the third embodiment of the phase shifter 10c is set to the third state. Differences between the values along the plot 304a-2 and the plot 304b-2 for a given frequency range yields the relative phase shifts that are effectuated upon the RF signal from the first state to the third state, referred to as the angle delta.

The graph of FIG. 18B shows a plot 306a-2 and a plot 306b-2 of the simulated amplitude components of the forward transmission coefficient (S21), that is, the loss or attenuation of a signal applied to an RF input signal to the first port 11 and output at the second port 12. The plot 306a-2 is when the third embodiment of the phase shifter 10c is set to the first state, and the plot 306b-2 is when the third embodiment of the phase shifter 10c is set to the third state. Differences between the values along the plot 306a-2 and the plot 306b-2 for a given frequency range yields the relative loss or attenuation of the RF signal from the first state to the third state, referred to as the loss delta.

The graph of FIG. 18C shows a plot 308a-2 and a plot 308b-2 of the simulated first port reflection coefficient (S11) or input return loss when the third embodiment of the phase shifter 10c is in the first state and the third state, respectively. There is additionally a plot 310a-2 and a plot 310b-2 of the simulated second port reflection coefficient (S22) or input return loss when the third embodiment of the phase shifter 10c is in the first state and the third state, respectively. The plots 308 are for the input RF signal being applied to the first port 11, whereas the plots 310 are for the input RF signal being applied to the second port 12.

The following table 10 summarizes the simulated performance of the third embodiment of the phase shifter 10c when in the first state and the third state, corresponding to the target phase shift of 5.6 degrees. The simulated values are organized according to the discrete 5G mmWave operating frequencies of 24.24 GHz, 27.0 GHz, and 29.5 GHz, with the actual computed values being those that of frequencies closest thereto. The values of the first resistor R1, the second resistor R2, and the third resistor R3 utilized for this simulation are also provided.

TABLE 10

|  | 24.25 GHz | 27.0 GHz | 29.5 GHz |
| --- | --- | --- | --- |
| Target shift (degrees) |  | 5.6 |  |
| Angle delta, (degrees) | 5.66 | 5.64 | 5.63 |
| Loss delta (dB) | 0.42 | 0.53 | 0.62 |
| Max S11 (dB) | −12.0 | −13.01 | −13.9 |
| Max loss (dB) | −1.18 | −1.23 | −1.28 |
| R1 (Ohm) |  | 5 |  |
| R2 (Ohm) |  | 41 |  |
| R3 (Ohm) |  | 37 |  |

Only a small variation in phase shift from the 5.6 degrees target, and more specifically, specifically less than +0.13 degrees or −0.08 degrees of variation. There is understood to be less than 0.62 dB variation with respect to the forward transmission coefficient/signal attenuation S21 across the full frequency band. According to the simulation, there is a low maximum insertion loss of less than 1.28 dB across the full frequency band. Furthermore, the worst-case input return loss (S11) appears to be less than −12 dB across the full frequency band.

The following table 11 summarizes the simulated performance of the third embodiment of the phase shifter 10c, with the aforementioned alternative configuration in which there is only a single transistor/resistor for the 5.6 degrees phase shift step.

TABLE 11

|  | 24.25 GHz | 27.0 GHz | 29.5 GHz |
| --- | --- | --- | --- |
| Target shift (degrees) |  | 5.6 |  |
| Angle delta, (degrees) | 5.66 | 5.64 | 5.63 |
| Loss delta (dB) | 0.42 | 0.53 | 0.62 |
| Max S11 (dB) | −12.0 | −13.01 | −13.9 |
| Max loss (dB) | −1.18 | −1.23 | −1.28 |
| R1 (Ohm) |  | 5 |  |
| R2 (Ohm) |  | 0 |  |
| R3 (Ohm) |  | 78 |  |

The following table 12 summarizes the simulated performance of the third embodiment of the phase shifter 10c when it is operated to effectuate a 2.8 degrees phase shift from the second state to the third state. In this operation, it is contemplated to exhibit a low loss delta of less than 0.15 dB across the entire frequency band for the 2.8 degrees phase shifter segment, while also maintain a low phase shift delta of less than 0.16 degrees across the full frequency band.

TABLE 12

|  | 24.25 GHz | 27.0 GHz | 29.5 GHz |
| --- | --- | --- | --- |
| Target shift (degrees) |  | 2.8 |  |
| Angle delta, (degrees) | 2.74 | 2.84 | 2.96 |
| Loss delta (dB) | 0.04 | 0.1 | 0.15 |
| Max S11 (dB) | −13.1 | −13.96 | −14.63 |
| Max loss (dB) | −1.18 | −1.23 | −1.28 |
| R1 (Ohm) |  | 5 |  |
| R2 (Ohm) |  | 41 |  |
| R3 (Ohm) |  | 37 |  |

Although the features of the present disclosure were considered in the context of 2.8 degrees and 5.6 degrees phase shifts, such features are understood to be adaptable for 11.25 degrees and 22.5 degrees phase shifts. The fine adjustment of phase shifter performance parameters is possible with different combinations of components, that is, capacitors, inductors, and resistors, and such modifications are deemed to be within the purview of those having ordinary skill in the art. It will be further appreciated that the phase shifter may be reconfigured for use with different frequency bands with appropriate circuit tuning. A full electromagnetic simulation that accounts for circuit parasitics such as RF switch capacitance, metal trace loss and coupling, and so on, may be performed in the course of such tuning and reconfiguring.

The phase shifters in accordance with the present disclosure are contemplated to have a small size, low insertion loss, and high tolerance, that is, exhibit minimal variation in phase step and insertion loss over a wide frequency range at mmWave operating frequencies that are suitable for 5G beamformers. Furthermore, with the use of only passive components, zero current consumption is possible. The phase shifters may be implemented directly on the semiconductor die, and a wide variety of fabrication technologies may be utilized therefor. In one preferred, though optional embodiment, the phase shifter 10 may be fabricated with a bulk CMOS (Complementary Metal Oxide Semiconductor) process, which is contemplated to contribute to the reduction of insertion loss at mmWave frequencies. However, any other fabrication modality or technology node may be utilized without departing from the scope of the present disclosure. Although the embodiments of the phase shifter 10 have been described as being suitable for mmWave frequencies, it will be appreciated by those having ordinary skill in the art that the features thereof may be adapted for other operating frequencies and are therefore deemed to be within the scope of the present disclosure.

The particulars shown herein are by way of example and for purposes of illustrative discussion of the embodiments of the present disclosure only and are presented in the cause of providing what is believed to be the most useful and readily understood description of the principles and conceptual aspects of the present disclosure. In this regard, no attempt is made to show details of these embodiments with more particularity than is necessary for the fundamental understanding of the present disclosure, the description taken with the drawings making apparent to those skilled in the art how the several forms of the present disclosure may be embodied in practice.

What is claimed is:

1. A phase shifter with a first port and a second port, comprising:
   a center inductor electrically connected to the first port and the second port;
   a first peripheral inductor electromagnetically coupled to the center inductor;
   a second peripheral inductor electromagnetically connected to the center inductor;
   a resistor network including a plurality of resistors electrically connected in series with the first peripheral inductor and the second peripheral inductor;
   a first transistor switch connected in parallel with a first one of the plurality of resistors; and
   a second transistor switch connected in parallel with a second one of the plurality of resistors.

2. The phase shifter of claim 1, wherein activation of the first transistor switch and the second transistor switch selectively shunt the corresponding one of the first one of the plurality of resistors and the second one of the plurality of resistors to which the respective first transistor switch and the second transistor switch are connected in parallel.

3. The phase shifter of claim 2, further comprising an interconnection inductor connected to the second peripheral inductor and the second transistor switch.

4. The phase shifter of claim 2, wherein the resistor network includes a third one of the plurality of resistors connected to the first transistor switch and to the first peripheral inductor.

5. The phase shifter of claim 4, wherein a first phase shift is applied to a transmission signal from the first port to the second port with the first transistor switch being activated and shunting the first one of the resistors, and with the second transistor switch being activating and shunting the second one of the resistors.

6. The phase shifter of claim 4, wherein a second phase shift is applied to a transmission signal from the first port to the second port with the first transistor switch being deactivated and the first one of the resistors being in a series circuit with the first peripheral inductor, the second peripheral inductor, and the third one of the plurality of resistors, and the second transistor switch being activated and shunting the second one of the resistors.

7. The phase shifter of claim 6, wherein the second phase shift is approximately 2.8 degrees.

8. The phase shifter of claim 4, wherein a third phase shift is applied to a transmission signal from the first port of the second port with the first transistor switch and the second transistor switch being deactivated and the first one of the resistors and the second one of the resistors being in a series circuit with the first peripheral inductor, the second peripheral inductor, and the third one of the plurality of resistors.

9. The phase shifter of claim 8, wherein the third phase shift is approximately 5.6 degrees.

10. The phase shifter of claim 4, wherein a third phase shift is applied to a transmission signal from the first port of the second port with the first transistor switch being activated and shunting the first one of the resistors, and the second transistor switch being deactivated and the second one of the resistors being in a series circuit with the first peripheral inductor, the second peripheral inductor, and the third one of the plurality of resistors.

11. The phase shifter of claim 4, wherein the third one of the plurality of resistors corresponds to metal trace loss.

12. The phase shifter of claim 4, wherein the third one of the plurality of resistors is implemented on-die.

13. The phase shifter of claim 1, wherein the transistor switches include field effect transistors with a gate, a source, and a drain.

14. The phase shifter of claim 1, further comprising a parallel capacitor connected to the first port and to the second port.

15. The phase shifter of claim 1, further comprising a series capacitor connected to the first port and to the center inductor.

16. A phase shifter with a first port and a second port, comprising:
    a triple inductor network including a center inductor connected to the first port and the second port, and first and second peripheral inductors each electromagnetically coupled thereto; and
    a resistance switch network connected to the first and second peripheral inductors, the resistance switch network being selectively activatable to set a first state defined at least by a first resistance in a series circuit with the first and second peripheral inductors, a second state defined at least by a second resistance in the series circuit, and a third state defined at least by a third resistance in the series circuit, with a transmission signal from the first port to the second port being shifted in phase by a prescribed angle corresponding to forward transmission coefficients for the first state, second state, and third state.

17. The phase shifter of claim 16, wherein the resistance switch network includes:
    a first resistor corresponding to the first resistance;
    a second resistor connected in series with the first resistor; and
    a first transistor connected in parallel with the second resistor, the second resistor being shunted with the first transistor activated, and contributing a resistance of the second resistor to the second resistance with the first transistor deactivated.

18. The phase shifter of claim 17, wherein the resistance switch network further includes:
a third resistor connected in series with the second resistor and the first resistor; and
a second transistor connected in parallel with the third resistor, the third resistor being shunted with the second transistor activated, and contributing a resistance of the third resistor to the third resistance with the second transistor deactivated.

19. The phase shifter of claim 16, further comprising a parallel capacitor connected to the first port and to the second port.

20. The phase shifter of claim 16, further comprising a series capacitor connected to the first port and to the center inductor of the triple inductor network.

* * * * *